(12) United States Patent
Simon et al.

(10) Patent No.: US 8,556,452 B2
(45) Date of Patent: Oct. 15, 2013

(54) LED LENS

(75) Inventors: David L. Simon, Grosse Pointe Woods, MI (US); John Ivey, Farmington Hills, MI (US); Gordon R. Lavering, Belmont, CA (US)

(73) Assignee: iLumisys, Inc., Troy, MI (US)

( * ) Notice: Subject to any disclaimer, the term of this patent is extended or adjusted under 35 U.S.C. 154(b) by 326 days.

(21) Appl. No.: 12/687,519

(22) Filed: Jan. 14, 2010

(65) Prior Publication Data

US 2010/0177532 A1  Jul. 15, 2010

Related U.S. Application Data

(60) Provisional application No. 61/144,853, filed on Jan. 15, 2009.

(51) Int. Cl.
*F21V 7/00*  (2006.01)

(52) U.S. Cl.
USPC ..................................... 362/217.07; 362/223

(58) Field of Classification Search
USPC ............. 362/217.02, 217.04, 217.05, 217.07, 362/217.08, 223
See application file for complete search history.

(56) References Cited

U.S. PATENT DOCUMENTS

| 54,511 A | 2/1920 | Owen |
|---|---|---|
| 58,105 A | 6/1921 | Poritz |
| 79,814 A | 8/1929 | Hoch |
| 80,419 A | 1/1930 | Kramer |
| 84,763 A | 7/1931 | Stange |
| D119,797 S | 4/1940 | Winkler et al. |
| D125,312 S | 2/1941 | Logan |
| 2,909,097 A | 10/1959 | Alden et al. |
| 3,318,185 A | 5/1967 | Kott |
| 3,561,719 A | 2/1971 | Grindle |
| 3,586,936 A | 6/1971 | McLeroy |
| 3,601,621 A | 8/1971 | Ritchie |
| 3,612,855 A | 10/1971 | Juhnke |
| 3,643,088 A | 2/1972 | Osteen et al. |
| 3,746,918 A | 7/1973 | Drucker et al. |
| 3,818,216 A | 6/1974 | Larraburu |
| 3,832,503 A | 8/1974 | Crane |

(Continued)

FOREIGN PATENT DOCUMENTS

| CN | 1584388 A | 2/2005 |
|---|---|---|
| CN | 2766345 Y | 3/2006 |

(Continued)

OTHER PUBLICATIONS

Wolsey, Robert. Interoperable Systems: The Future of Lighting Control, Lighting Research Center, Jan. 1, 1997, vol. 2 No. 2, Rensselaer Polytechnic Institute, Troy, New York [online]. Retrieved Lighting Research Center Web Page using Internet <URL: http://www.lrc.rpi.edu/programs/Futures/LF-BAS/index.asp>.

(Continued)

*Primary Examiner* — Julie Shallenberger
(74) *Attorney, Agent, or Firm* — Young Basile

(57) ABSTRACT

A light modifier for an LED producing light about a central axis is provided. The light modifier includes a lens defining an indentation. The indentation is angled relative to the central axis by an amount less than a complementary angle of a critical angle of the lens along the indentation. The lens can reduce the appearance of a bright spot created by the LED.

22 Claims, 10 Drawing Sheets

(56) References Cited

U.S. PATENT DOCUMENTS

| | | |
|---|---|---|
| 3,858,086 A | 12/1974 | Anderson et al. |
| 3,909,670 A | 9/1975 | Wakamatsu et al. |
| 3,924,120 A | 12/1975 | Cox, III |
| 3,958,885 A | 5/1976 | Stockinger et al. |
| 3,974,637 A | 8/1976 | Bergey et al. |
| 3,993,386 A | 11/1976 | Rowe |
| 4,001,571 A | 1/1977 | Martin |
| 4,054,814 A | 10/1977 | Fegley et al. |
| 4,070,568 A | 1/1978 | Gala |
| 4,082,395 A | 4/1978 | Donato et al. |
| 4,096,349 A | 6/1978 | Donato |
| 4,102,558 A | 7/1978 | Krachman |
| 4,107,581 A | 8/1978 | Abernethy |
| 4,189,663 A | 2/1980 | Schmutzer et al. |
| 4,211,955 A | 7/1980 | Ray |
| 4,241,295 A | 12/1980 | Williams, Jr. |
| 4,271,408 A | 6/1981 | Teshima et al. |
| 4,272,689 A | 6/1981 | Crosby et al. |
| 4,273,999 A | 6/1981 | Pierpoint |
| 4,298,869 A | 11/1981 | Okuno |
| 4,329,625 A | 5/1982 | Nishizawa et al. |
| 4,339,788 A | 7/1982 | White et al. |
| 4,342,947 A | 8/1982 | Bloyd |
| 4,367,464 A | 1/1983 | Kurahashi et al. |
| D268,134 S | 3/1983 | Zurcher |
| 4,382,272 A | 5/1983 | Quella et al. |
| 4,388,567 A | 6/1983 | Yamazaki et al. |
| 4,388,589 A | 6/1983 | Molldrem, Jr. |
| 4,392,187 A | 7/1983 | Bornhorst |
| 4,394,719 A | 7/1983 | Moberg |
| 4,420,711 A | 12/1983 | Takahashi et al. |
| 4,455,562 A | 6/1984 | Dolan et al. |
| 4,500,796 A | 2/1985 | Quin |
| 4,581,687 A | 4/1986 | Nakanishi |
| 4,597,033 A | 6/1986 | Meggs et al. |
| 4,600,972 A | 7/1986 | MacIntyre |
| 4,607,317 A | 8/1986 | Lin |
| 4,622,881 A | 11/1986 | Rand |
| 4,625,152 A | 11/1986 | Nakai |
| 4,635,052 A | 1/1987 | Aoike et al. |
| 4,647,217 A | 3/1987 | Havel |
| 4,656,398 A | 4/1987 | Michael et al. |
| 4,661,890 A | 4/1987 | Watanabe et al. |
| 4,668,895 A | 5/1987 | Schneiter |
| 4,675,575 A | 6/1987 | Smith et al. |
| 4,682,079 A | 7/1987 | Sanders et al. |
| 4,686,425 A | 8/1987 | Havel |
| 4,687,340 A | 8/1987 | Havel |
| 4,688,154 A | 8/1987 | Nilssen |
| 4,688,869 A | 8/1987 | Kelly |
| 4,695,769 A | 9/1987 | Schweickardt |
| 4,698,730 A | 10/1987 | Sakai et al. |
| 4,701,669 A | 10/1987 | Head et al. |
| 4,705,406 A | 11/1987 | Havel |
| 4,707,141 A | 11/1987 | Havel |
| D293,723 S | 1/1988 | Buttner |
| 4,727,289 A | 2/1988 | Uchida |
| 4,740,882 A | 4/1988 | Miller |
| 4,748,545 A | 5/1988 | Schmitt |
| 4,753,148 A | 6/1988 | Johnson |
| 4,758,173 A | 7/1988 | Northrop |
| 4,771,274 A | 9/1988 | Havel |
| 4,780,621 A | 10/1988 | Bartleucci et al. |
| 4,794,383 A | 12/1988 | Havel |
| 4,810,937 A | 3/1989 | Havel |
| 4,818,072 A | 4/1989 | Mohebban |
| 4,824,269 A | 4/1989 | Havel |
| 4,837,565 A | 6/1989 | White |
| 4,843,627 A | 6/1989 | Stebbins |
| 4,845,481 A | 7/1989 | Havel |
| 4,845,745 A | 7/1989 | Havel |
| 4,857,801 A | 8/1989 | Farrell |
| 4,863,223 A | 9/1989 | Weissenbach et al. |
| 4,870,325 A | 9/1989 | Kazar |
| 4,874,320 A | 10/1989 | Freed et al. |
| 4,887,074 A | 12/1989 | Simon et al. |
| 4,894,832 A | 1/1990 | Colak |
| 4,901,207 A | 2/1990 | Sato et al. |
| 4,912,371 A | 3/1990 | Hamilton |
| 4,922,154 A | 5/1990 | Cacoub |
| 4,934,852 A | 6/1990 | Havel |
| 4,941,072 A | 7/1990 | Yasumoto et al. |
| 4,943,900 A | 7/1990 | Gartner |
| 4,962,687 A | 10/1990 | Belliveau et al. |
| 4,965,561 A | 10/1990 | Havel |
| 4,973,835 A | 11/1990 | Kurosu et al. |
| 4,979,081 A | 12/1990 | Leach et al. |
| 4,980,806 A | 12/1990 | Taylor et al. |
| 4,992,704 A | 2/1991 | Stinson |
| 5,003,227 A | 3/1991 | Nilssen |
| 5,008,595 A | 4/1991 | Kazar |
| 5,008,788 A | 4/1991 | Palinkas |
| 5,010,459 A | 4/1991 | Taylor et al. |
| 5,018,054 A | 5/1991 | Ohashi et al. |
| 5,027,037 A | 6/1991 | Wei |
| 5,027,262 A | 6/1991 | Freed |
| 5,032,960 A | 7/1991 | Katoh |
| 5,034,807 A | 7/1991 | Von Kohorn |
| 5,036,248 A | 7/1991 | McEwan et al. |
| 5,038,255 A | 8/1991 | Nishihashi et al. |
| 5,065,226 A | 11/1991 | Kluitmans et al. |
| 5,072,216 A | 12/1991 | Grange |
| 5,078,039 A | 1/1992 | Tulk et al. |
| 5,083,063 A | 1/1992 | Brooks |
| 5,088,013 A | 2/1992 | Revis |
| 5,089,748 A | 2/1992 | Ihms |
| 5,103,382 A | 4/1992 | Kondo et al. |
| 5,122,733 A | 6/1992 | Havel |
| 5,126,634 A | 6/1992 | Johnson |
| 5,128,595 A | 7/1992 | Hara |
| 5,130,909 A | 7/1992 | Gross |
| 5,134,387 A | 7/1992 | Smith et al. |
| 5,140,220 A | 8/1992 | Hasegawa |
| 5,142,199 A | 8/1992 | Elwell |
| 5,151,679 A | 9/1992 | Dimmick |
| 5,154,641 A | 10/1992 | McLaughlin |
| 5,161,879 A | 11/1992 | McDermott |
| 5,161,882 A | 11/1992 | Garrett |
| 5,164,715 A | 11/1992 | Kashiwabara et al. |
| 5,184,114 A | 2/1993 | Brown |
| 5,194,854 A | 3/1993 | Havel |
| 5,198,756 A | 3/1993 | Jenkins et al. |
| 5,209,560 A | 5/1993 | Taylor et al. |
| 5,220,250 A | 6/1993 | Szuba |
| 5,225,765 A | 7/1993 | Callahan et al. |
| 5,226,723 A | 7/1993 | Chen |
| 5,254,910 A | 10/1993 | Yang |
| 5,256,948 A | 10/1993 | Boldin et al. |
| 5,278,542 A | 1/1994 | Smith et al. |
| 5,282,121 A | 1/1994 | Bornhorst et al. |
| 5,283,517 A | 2/1994 | Havel |
| 5,287,352 A | 2/1994 | Jackson et al. |
| 5,294,865 A | 3/1994 | Haraden |
| 5,298,871 A | 3/1994 | Shimohara |
| 5,301,090 A | 4/1994 | Hed |
| 5,303,124 A | 4/1994 | Wrobel |
| 5,307,295 A | 4/1994 | Taylor et al. |
| 5,321,593 A | 6/1994 | Moates |
| 5,323,226 A | 6/1994 | Schreder |
| 5,329,431 A | 7/1994 | Taylor et al. |
| 5,344,068 A | 9/1994 | Haessig |
| 5,350,977 A | 9/1994 | Hamamoto et al. |
| 5,357,170 A | 10/1994 | Luchaco et al. |
| 5,371,618 A | 12/1994 | Tai et al. |
| 5,374,876 A | 12/1994 | Horibata et al. |
| 5,375,043 A | 12/1994 | Tokunaga |
| 5,377,072 A | 12/1994 | Sparkman et al. |
| D354,360 S | 1/1995 | Murata |
| 5,381,074 A | 1/1995 | Rudzewicz et al. |
| 5,388,357 A | 2/1995 | Malita |
| 5,402,702 A | 4/1995 | Hata |
| 5,404,282 A | 4/1995 | Klinke et al. |
| 5,406,176 A | 4/1995 | Sugden |
| 5,410,328 A | 4/1995 | Yoksza et al. |

(56) References Cited

U.S. PATENT DOCUMENTS

| | | |
|---|---|---|
| 5,412,284 A | 5/1995 | Moore et al. |
| 5,412,552 A | 5/1995 | Fernandes |
| 5,420,482 A | 5/1995 | Phares |
| 5,421,059 A | 6/1995 | Leffers, Jr. |
| 5,430,356 A | 7/1995 | Ference et al. |
| 5,432,408 A | 7/1995 | Matsuda et al. |
| 5,436,535 A | 7/1995 | Yang |
| 5,436,853 A | 7/1995 | Shimohara |
| 5,450,301 A | 9/1995 | Waltz et al. |
| 5,461,188 A | 10/1995 | Drago et al. |
| 5,463,280 A | 10/1995 | Johnson |
| 5,463,502 A | 10/1995 | Savage, Jr. |
| 5,465,144 A | 11/1995 | Parker et al. |
| 5,475,300 A | 12/1995 | Havel |
| 5,489,827 A | 2/1996 | Xia |
| 5,491,402 A | 2/1996 | Small |
| 5,493,183 A | 2/1996 | Kimball |
| 5,504,395 A | 4/1996 | Johnson et al. |
| 5,506,760 A | 4/1996 | Giebler et al. |
| 5,513,082 A | 4/1996 | Asano |
| 5,519,496 A | 5/1996 | Borgert et al. |
| 5,530,322 A | 6/1996 | Ference et al. |
| 5,544,809 A | 8/1996 | Keating et al. |
| 5,545,950 A | 8/1996 | Cho |
| 5,550,440 A | 8/1996 | Allison et al. |
| 5,559,681 A | 9/1996 | Duarte |
| 5,561,346 A | 10/1996 | Byrne |
| D376,030 S | 11/1996 | Cohen |
| 5,575,459 A | 11/1996 | Anderson |
| 5,575,554 A | 11/1996 | Guritz |
| 5,581,158 A | 12/1996 | Quazi |
| 5,592,051 A | 1/1997 | Korkala |
| 5,592,054 A | 1/1997 | Nerone et al. |
| 5,600,199 A | 2/1997 | Martin, Sr. et al. |
| 5,607,227 A | 3/1997 | Yasumoto et al. |
| 5,608,290 A | 3/1997 | Hutchisson et al. |
| 5,614,788 A | 3/1997 | Mullins et al. |
| 5,621,282 A | 4/1997 | Haskell |
| 5,621,603 A | 4/1997 | Adamec et al. |
| 5,621,662 A | 4/1997 | Humphries et al. |
| 5,622,423 A | 4/1997 | Lee |
| 5,633,629 A | 5/1997 | Hochstein |
| 5,634,711 A | 6/1997 | Kennedy et al. |
| 5,640,061 A | 6/1997 | Bornhorst et al. |
| 5,640,141 A | 6/1997 | Myllymaki |
| 5,642,129 A | 6/1997 | Zavracky et al. |
| 5,655,830 A | 8/1997 | Ruskouski |
| 5,656,935 A | 8/1997 | Havel |
| 5,661,374 A | 8/1997 | Cassidy et al. |
| 5,661,645 A | 8/1997 | Hochstein |
| 5,673,059 A | 9/1997 | Zavracky et al. |
| 5,682,103 A | 10/1997 | Burrell |
| 5,688,042 A | 11/1997 | Madadi et al. |
| 5,697,695 A | 12/1997 | Lin et al. |
| 5,701,058 A | 12/1997 | Roth |
| 5,712,650 A | 1/1998 | Barlow |
| 5,721,471 A | 2/1998 | Begemann et al. |
| 5,725,148 A | 3/1998 | Hartman |
| 5,726,535 A | 3/1998 | Yan |
| 5,731,759 A | 3/1998 | Finucan |
| 5,734,590 A | 3/1998 | Tebbe |
| 5,751,118 A | 5/1998 | Mortimer |
| 5,752,766 A | 5/1998 | Bailey et al. |
| 5,765,940 A | 6/1998 | Levy et al. |
| 5,769,527 A | 6/1998 | Taylor et al. |
| 5,784,006 A | 7/1998 | Hochstein |
| 5,785,227 A | 7/1998 | Akiba |
| 5,790,329 A | 8/1998 | Klaus et al. |
| 5,803,579 A | 9/1998 | Turnbull et al. |
| 5,803,580 A | 9/1998 | Tseng |
| 5,803,729 A | 9/1998 | Tsimerman |
| 5,806,965 A | 9/1998 | Deese |
| 5,808,689 A | 9/1998 | Small |
| 5,810,463 A | 9/1998 | Kawahara et al. |
| 5,812,105 A | 9/1998 | Van de Ven |
| 5,813,751 A | 9/1998 | Shaffer |
| 5,813,753 A | 9/1998 | Vriens et al. |
| 5,821,695 A | 10/1998 | Vilanilam et al. |
| 5,825,051 A | 10/1998 | Bauer et al. |
| 5,828,178 A | 10/1998 | York et al. |
| 5,836,676 A | 11/1998 | Ando et al. |
| 5,848,837 A | 12/1998 | Gustafson |
| 5,850,126 A | 12/1998 | Kanbar |
| 5,851,063 A | 12/1998 | Doughty et al. |
| 5,852,658 A | 12/1998 | Knight et al. |
| 5,854,542 A | 12/1998 | Forbes |
| RE36,030 E | 1/1999 | Nadeau |
| 5,859,508 A | 1/1999 | Ge et al. |
| 5,865,529 A | 2/1999 | Yan |
| 5,890,794 A | 4/1999 | Abtahi et al. |
| 5,896,010 A | 4/1999 | Mikolajczak et al. |
| 5,907,742 A | 5/1999 | Johnson et al. |
| 5,912,653 A | 6/1999 | Fitch |
| 5,921,660 A | 7/1999 | Yu |
| 5,924,784 A | 7/1999 | Chliwnyj et al. |
| 5,927,845 A | 7/1999 | Gustafson et al. |
| 5,934,792 A | 8/1999 | Camarota |
| 5,943,802 A | 8/1999 | Tijanic |
| 5,946,209 A | 8/1999 | Eckel et al. |
| 5,949,347 A | 9/1999 | Wu |
| 5,952,680 A | 9/1999 | Strite |
| 5,959,547 A | 9/1999 | Tubel et al. |
| 5,962,989 A | 10/1999 | Baker |
| 5,962,992 A | 10/1999 | Huang et al. |
| 5,963,185 A | 10/1999 | Havel |
| 5,974,553 A | 10/1999 | Gandar |
| 5,980,064 A | 11/1999 | Metroyanis |
| 5,998,925 A | 12/1999 | Shimizu et al. |
| 5,998,928 A | 12/1999 | Hipp |
| 6,007,209 A | 12/1999 | Pelka |
| 6,008,783 A | 12/1999 | Kitagawa et al. |
| 6,011,691 A | 1/2000 | Schreffler |
| 6,016,038 A | 1/2000 | Mueller et al. |
| 6,018,237 A | 1/2000 | Havel |
| 6,019,493 A | 2/2000 | Kuo et al. |
| 6,020,825 A | 2/2000 | Chansky et al. |
| 6,025,550 A | 2/2000 | Kato |
| 6,028,694 A | 2/2000 | Schmidt |
| 6,030,099 A | 2/2000 | McDermott |
| 6,031,343 A | 2/2000 | Recknagel et al. |
| D422,737 S | 4/2000 | Orozco |
| 6,056,420 A | 5/2000 | Wilson et al. |
| 6,068,383 A | 5/2000 | Robertson et al. |
| 6,069,597 A | 5/2000 | Hansen |
| 6,072,280 A | 6/2000 | Allen |
| 6,084,359 A | 7/2000 | Hetzel et al. |
| 6,086,220 A | 7/2000 | Lash et al. |
| 6,091,200 A | 7/2000 | Lenz |
| 6,092,915 A | 7/2000 | Rensch |
| 6,095,661 A | 8/2000 | Lebens et al. |
| 6,097,352 A | 8/2000 | Zavracky et al. |
| 6,116,748 A | 9/2000 | George |
| 6,121,875 A | 9/2000 | Hamm et al. |
| 6,127,783 A | 10/2000 | Pashley et al. |
| 6,132,072 A | 10/2000 | Turnbull et al. |
| 6,135,604 A | 10/2000 | Lin |
| 6,139,174 A | 10/2000 | Butterworth |
| 6,149,283 A | 11/2000 | Conway et al. |
| 6,150,774 A | 11/2000 | Mueller et al. |
| 6,151,529 A | 11/2000 | Batko |
| 6,153,985 A | 11/2000 | Grossman |
| 6,158,882 A | 12/2000 | Bischoff, Jr. |
| 6,166,496 A | 12/2000 | Lys et al. |
| 6,175,201 B1 | 1/2001 | Sid |
| 6,175,220 B1 | 1/2001 | Billig et al. |
| 6,181,126 B1 | 1/2001 | Havel |
| 6,183,086 B1 | 2/2001 | Neubert |
| 6,183,104 B1 | 2/2001 | Ferrara |
| 6,184,628 B1 | 2/2001 | Ruthenberg |
| 6,196,471 B1 | 3/2001 | Ruthenberg |
| 6,203,180 B1 | 3/2001 | Fleischmann |
| 6,211,626 B1 | 4/2001 | Lys et al. |
| 6,215,409 B1 | 4/2001 | Blach |
| 6,217,190 B1 | 4/2001 | Altman et al. |

(56) References Cited

U.S. PATENT DOCUMENTS

| | | | |
|---|---|---|---|
| 6,219,239 B1 | 4/2001 | Mellberg et al. |
| 6,227,679 B1 | 5/2001 | Zhang et al. |
| 6,238,075 B1 | 5/2001 | Dealey, Jr. et al. |
| 6,241,359 B1 | 6/2001 | Lin |
| 6,250,774 B1 | 6/2001 | Begemann et al. |
| 6,252,350 B1 | 6/2001 | Alvarez |
| 6,252,358 B1 | 6/2001 | Xydis et al. |
| 6,268,600 B1 | 7/2001 | Nakamura et al. |
| 6,273,338 B1 | 8/2001 | White |
| 6,275,397 B1 | 8/2001 | McClain |
| 6,283,612 B1 | 9/2001 | Hunter |
| 6,292,901 B1 | 9/2001 | Lys et al. |
| 6,293,684 B1 | 9/2001 | Riblett |
| 6,297,724 B1 | 10/2001 | Bryans et al. |
| 6,305,109 B1 | 10/2001 | Lee |
| 6,305,821 B1 | 10/2001 | Hsieh et al. |
| 6,307,331 B1 | 10/2001 | Bonasia et al. |
| 6,310,590 B1 | 10/2001 | Havel |
| 6,323,832 B1 | 11/2001 | Nishizawa et al. |
| 6,325,651 B1 | 12/2001 | Nishihara et al. |
| 6,334,699 B1 | 1/2002 | Gladnick |
| 6,340,868 B1 | 1/2002 | Lys et al. |
| 6,354,714 B1 | 3/2002 | Rhodes |
| 6,361,186 B1 | 3/2002 | Slayden |
| 6,369,525 B1 | 4/2002 | Chang et al. |
| 6,371,637 B1 | 4/2002 | Atchinson et al. |
| 6,379,022 B1 | 4/2002 | Amerson et al. |
| D457,667 S | 5/2002 | Piepgras et al. |
| D457,669 S | 5/2002 | Piepgras et al. |
| D457,974 S | 5/2002 | Piepgras et al. |
| 6,388,393 B1 | 5/2002 | Illingworth |
| 6,394,623 B1 | 5/2002 | Tsui |
| D458,395 S | 6/2002 | Piepgras et al. |
| 6,400,096 B1 | 6/2002 | Wells et al. |
| 6,404,131 B1 | 6/2002 | Kawano et al. |
| 6,411,022 B1 | 6/2002 | Machida |
| 6,422,716 B2 | 7/2002 | Henrici et al. |
| 6,428,189 B1 | 8/2002 | Hochstein |
| D463,610 S | 9/2002 | Piepgras et al. |
| 6,445,139 B1 | 9/2002 | Marshall et al. |
| 6,448,550 B1 | 9/2002 | Nishimura |
| 6,448,716 B1 | 9/2002 | Hutchison |
| 6,459,919 B1 | 10/2002 | Lys et al. |
| 6,469,457 B2 | 10/2002 | Callahan |
| 6,471,388 B1 | 10/2002 | Marsh |
| 6,472,823 B2 | 10/2002 | Yen |
| 6,473,002 B1 | 10/2002 | Hutchison |
| D468,035 S | 12/2002 | Blanc et al. |
| 6,495,964 B1 | 12/2002 | Muthu et al. |
| 6,526,954 B1 | 3/2003 | Baranzahi et al. |
| 6,527,411 B1 | 3/2003 | Sayers |
| 6,528,958 B2 | 3/2003 | Hulshof et al. |
| 6,538,375 B1 | 3/2003 | Duggal et al. |
| 6,548,967 B1 | 4/2003 | Dowling et al. |
| 6,568,834 B1 | 5/2003 | Scianna |
| 6,573,536 B1 | 6/2003 | Dry |
| 6,577,080 B2 | 6/2003 | Lys et al. |
| 6,577,512 B2 | 6/2003 | Tripathi et al. |
| 6,577,794 B1 | 6/2003 | Currie et al. |
| 6,578,979 B2 | 6/2003 | Truttmann-Battig |
| 6,582,103 B1 * | 6/2003 | Popovich et al. ............ 362/307 |
| 6,583,550 B2 | 6/2003 | Iwasa et al. |
| 6,583,573 B2 | 6/2003 | Bierman |
| 6,585,393 B1 | 7/2003 | Brandes et al. |
| 6,586,890 B2 | 7/2003 | Min et al. |
| 6,590,343 B2 | 7/2003 | Pederson |
| 6,592,238 B2 | 7/2003 | Cleaver et al. |
| 6,596,977 B2 | 7/2003 | Muthu et al. |
| 6,598,996 B1 | 7/2003 | Lodhie |
| 6,608,453 B2 | 8/2003 | Morgan et al. |
| 6,608,614 B1 | 8/2003 | Johnson |
| 6,609,804 B2 | 8/2003 | Nolan et al. |
| 6,612,712 B2 | 9/2003 | Nepil |
| 6,612,717 B2 | 9/2003 | Yen |
| 6,621,222 B1 | 9/2003 | Hong |
| 6,623,151 B2 | 9/2003 | Pederson |
| 6,624,597 B2 | 9/2003 | Dowling et al. |
| D481,484 S | 10/2003 | Cuevas et al. |
| 6,634,770 B2 | 10/2003 | Cao |
| 6,634,779 B2 | 10/2003 | Reed |
| 6,636,003 B2 | 10/2003 | Rahm et al. |
| 6,639,349 B1 | 10/2003 | Bahadur |
| 6,641,284 B2 | 11/2003 | Stopa et al. |
| 6,659,622 B2 | 12/2003 | Katogi et al. |
| 6,660,935 B2 | 12/2003 | Southard et al. |
| 6,666,689 B1 | 12/2003 | Savage, Jr. |
| 6,667,623 B2 | 12/2003 | Bourgault et al. |
| 6,674,096 B2 * | 1/2004 | Sommers ..................... 257/98 |
| 6,676,284 B1 | 1/2004 | Wynne Willson |
| 6,679,621 B2 | 1/2004 | West et al. |
| 6,681,154 B2 | 1/2004 | Nierlich et al. |
| 6,682,205 B2 | 1/2004 | Lin |
| 6,683,419 B2 | 1/2004 | Kriparos |
| 6,700,136 B2 | 3/2004 | Guida |
| 6,712,486 B1 | 3/2004 | Popovich et al. |
| 6,717,376 B2 | 4/2004 | Lys et al. |
| 6,717,526 B2 | 4/2004 | Martineau et al. |
| 6,720,745 B2 | 4/2004 | Lys et al. |
| 6,726,348 B2 | 4/2004 | Gloisten |
| 6,741,324 B1 | 5/2004 | Kim |
| D491,678 S | 6/2004 | Piepgras |
| D492,042 S | 6/2004 | Piepgras |
| 6,744,223 B2 | 6/2004 | Laflamme et al. |
| 6,748,299 B1 | 6/2004 | Motoyama |
| 6,762,562 B2 | 7/2004 | Leong |
| 6,774,584 B2 | 8/2004 | Lys et al. |
| 6,777,891 B2 | 8/2004 | Lys et al. |
| 6,781,329 B2 | 8/2004 | Mueller et al. |
| 6,787,999 B2 | 9/2004 | Stimac et al. |
| 6,788,000 B2 | 9/2004 | Appelberg et al. |
| 6,788,011 B2 | 9/2004 | Mueller et al. |
| 6,791,840 B2 | 9/2004 | Chun |
| 6,796,680 B1 | 9/2004 | Showers et al. |
| 6,801,003 B2 | 10/2004 | Schanberger et al. |
| 6,803,732 B2 | 10/2004 | Kraus et al. |
| 6,806,659 B1 | 10/2004 | Mueller et al. |
| 6,814,470 B2 | 11/2004 | Rizkin et al. |
| 6,815,724 B2 | 11/2004 | Dry |
| 6,846,094 B2 | 1/2005 | Luk |
| 6,851,816 B2 | 2/2005 | Wu et al. |
| 6,851,832 B2 | 2/2005 | Tieszen |
| 6,853,150 B2 | 2/2005 | Clauberg et al. |
| 6,853,151 B2 | 2/2005 | Leong et al. |
| 6,853,563 B1 | 2/2005 | Yang et al. |
| 6,857,924 B2 | 2/2005 | Fu et al. |
| 6,860,628 B2 | 3/2005 | Robertson et al. |
| 6,866,401 B2 | 3/2005 | Sommers et al. |
| 6,869,204 B2 | 3/2005 | Morgan et al. |
| 6,871,981 B2 | 3/2005 | Alexanderson et al. |
| 6,874,924 B1 | 4/2005 | Hulse et al. |
| 6,879,883 B1 | 4/2005 | Motoyama |
| 6,882,111 B2 | 4/2005 | Kan et al. |
| 6,883,929 B2 | 4/2005 | Dowling |
| 6,883,934 B2 | 4/2005 | Kawakami et al. |
| 6,888,322 B2 | 5/2005 | Dowling et al. |
| 6,888,392 B2 | 5/2005 | Wei et al. |
| 6,897,624 B2 | 5/2005 | Lys et al. |
| 6,909,239 B2 | 6/2005 | Gauna |
| 6,909,921 B1 | 6/2005 | Bilger |
| 6,918,580 B2 | 7/2005 | Obregon et al. |
| 6,918,680 B2 | 7/2005 | Seeberger |
| 6,921,181 B2 | 7/2005 | Yen |
| 6,936,968 B2 | 8/2005 | Cross et al. |
| 6,936,978 B2 | 8/2005 | Morgan et al. |
| 6,940,230 B2 | 9/2005 | Myron et al. |
| 6,948,829 B2 | 9/2005 | Verdes et al. |
| 6,957,905 B1 | 10/2005 | Pritchard et al. |
| 6,963,175 B2 | 11/2005 | Archenhold et al. |
| 6,964,501 B2 | 11/2005 | Ryan |
| 6,965,197 B2 | 11/2005 | Tyan et al. |
| 6,965,205 B2 | 11/2005 | Piepgras et al. |
| 6,967,448 B2 | 11/2005 | Morgan et al. |
| 6,969,179 B2 | 11/2005 | Sloan et al. |
| 6,969,186 B2 | 11/2005 | Sonderegger et al. |

(56) References Cited

U.S. PATENT DOCUMENTS

| | | |
|---|---|---|
| 6,969,954 B2 | 11/2005 | Lys |
| 6,975,079 B2 | 12/2005 | Lys et al. |
| 6,979,097 B2 | 12/2005 | Elam et al. |
| 6,982,518 B2 | 1/2006 | Chou et al. |
| 6,995,681 B2 | 2/2006 | Pederson |
| 6,997,576 B1 | 2/2006 | Lodhie et al. |
| 7,004,603 B2 | 2/2006 | Knight |
| D518,218 S | 3/2006 | Roberge et al. |
| 7,008,079 B2 | 3/2006 | Smith |
| 7,014,336 B1 | 3/2006 | Ducharme et al. |
| 7,015,650 B2 | 3/2006 | McGrath |
| 7,018,063 B2 | 3/2006 | Michael et al. |
| 7,021,799 B2 | 4/2006 | Mizuyoshi |
| 7,021,809 B2 | 4/2006 | Iwasa et al. |
| 7,024,256 B2 | 4/2006 | Krzyzanowski et al. |
| 7,031,920 B2 | 4/2006 | Dowling et al. |
| 7,033,036 B2 | 4/2006 | Pederson |
| 7,038,398 B1 | 5/2006 | Lys et al. |
| 7,038,399 B2 | 5/2006 | Lys et al. |
| 7,042,172 B2 | 5/2006 | Dowling et al. |
| 7,048,423 B2 | 5/2006 | Stepanenko et al. |
| 7,049,761 B2 | 5/2006 | Timmermans et al. |
| 7,052,171 B1 | 5/2006 | Lefebvre et al. |
| 7,053,557 B2 | 5/2006 | Cross et al. |
| 7,064,498 B2 | 6/2006 | Dowling et al. |
| 7,064,674 B2 | 6/2006 | Pederson |
| 7,067,992 B2 | 6/2006 | Leong et al. |
| 7,077,978 B2 | 7/2006 | Setlur et al. |
| 7,080,927 B2 | 7/2006 | Feuerborn et al. |
| 7,086,747 B2 | 8/2006 | Nielson et al. |
| 7,088,014 B2 | 8/2006 | Nierlich et al. |
| 7,088,904 B2 | 8/2006 | Ryan, Jr. |
| 7,102,902 B1 | 9/2006 | Brown et al. |
| 7,113,541 B1 | 9/2006 | Lys et al. |
| 7,114,830 B2 | 10/2006 | Robertson et al. |
| 7,114,834 B2 | 10/2006 | Rivas et al. |
| 7,118,262 B2 | 10/2006 | Negley |
| 7,119,503 B2 | 10/2006 | Kemper |
| 7,121,679 B2 | 10/2006 | Fujimoto |
| 7,122,976 B1 | 10/2006 | Null et al. |
| 7,128,442 B2 | 10/2006 | Lee et al. |
| 7,128,454 B2 | 10/2006 | Kim et al. |
| D532,532 S | 11/2006 | Maxik |
| 7,132,635 B2 | 11/2006 | Dowling |
| 7,132,785 B2 | 11/2006 | Ducharme |
| 7,132,804 B2 | 11/2006 | Lys et al. |
| 7,135,824 B2 | 11/2006 | Lys et al. |
| 7,139,617 B1 | 11/2006 | Morgan et al. |
| 7,144,135 B2 | 12/2006 | Martin et al. |
| 7,153,002 B2 | 12/2006 | Kim et al. |
| 7,161,311 B2 | 1/2007 | Mueller et al. |
| 7,161,313 B2 | 1/2007 | Piepgras et al. |
| 7,161,556 B2 | 1/2007 | Morgan et al. |
| 7,164,110 B2 | 1/2007 | Pitigoi-Aron et al. |
| 7,164,235 B2 | 1/2007 | Ito et al. |
| 7,165,863 B1 | 1/2007 | Thomas et al. |
| 7,165,866 B2 | 1/2007 | Li |
| 7,167,777 B2 | 1/2007 | Budike, Jr. |
| 7,168,843 B2 | 1/2007 | Striebel |
| D536,468 S | 2/2007 | Crosby |
| 7,178,941 B2 | 2/2007 | Roberge et al. |
| 7,180,252 B2 | 2/2007 | Lys et al. |
| D538,950 S | 3/2007 | Maxik |
| D538,952 S | 3/2007 | Maxik et al. |
| D538,962 S | 3/2007 | Elliott |
| 7,186,003 B2 | 3/2007 | Dowling et al. |
| 7,186,005 B2 | 3/2007 | Hulse |
| 7,187,141 B2 | 3/2007 | Mueller et al. |
| 7,190,126 B1 | 3/2007 | Paton |
| 7,192,154 B2 | 3/2007 | Becker |
| 7,198,387 B1 | 4/2007 | Gloisten et al. |
| 7,201,491 B2 | 4/2007 | Bayat et al. |
| 7,201,497 B2 | 4/2007 | Weaver, Jr. et al. |
| 7,202,613 B2 | 4/2007 | Morgan et al. |
| 7,204,615 B2 | 4/2007 | Arik et al. |
| 7,204,622 B2 | 4/2007 | Dowling et al. |
| 7,207,696 B1 | 4/2007 | Lin |
| 7,210,818 B2 | 5/2007 | Luk et al. |
| 7,210,957 B2 | 5/2007 | Mrakovich et al. |
| 7,211,959 B1 | 5/2007 | Chou |
| 7,213,934 B2 | 5/2007 | Zarian et al. |
| 7,217,004 B2 * | 5/2007 | Park et al. ................... 362/240 |
| 7,217,012 B2 | 5/2007 | Southard et al. |
| 7,217,022 B2 | 5/2007 | Ruffin |
| 7,218,056 B1 | 5/2007 | Harwood |
| 7,218,238 B2 | 5/2007 | Right et al. |
| 7,220,015 B2 | 5/2007 | Dowling |
| 7,220,018 B2 | 5/2007 | Crabb et al. |
| 7,221,104 B2 | 5/2007 | Lys et al. |
| 7,221,110 B2 | 5/2007 | Sears et al. |
| 7,224,000 B2 | 5/2007 | Aanegola et al. |
| 7,226,189 B2 | 6/2007 | Lee et al. |
| 7,228,052 B1 | 6/2007 | Lin |
| 7,228,190 B2 | 6/2007 | Dowling et al. |
| 7,231,060 B2 | 6/2007 | Dowling et al. |
| 7,233,115 B2 | 6/2007 | Lys |
| 7,233,831 B2 | 6/2007 | Blackwell |
| 7,236,366 B2 | 6/2007 | Chen |
| 7,237,924 B2 | 7/2007 | Martineau et al. |
| 7,237,925 B2 | 7/2007 | Mayer et al. |
| 7,239,532 B1 | 7/2007 | Hsu et al. |
| 7,241,038 B2 | 7/2007 | Naniwa et al. |
| 7,242,152 B2 | 7/2007 | Dowling et al. |
| 7,246,926 B2 | 7/2007 | Harwood |
| 7,246,931 B2 | 7/2007 | Hsieh et al. |
| 7,248,239 B2 | 7/2007 | Dowling et al. |
| 7,249,269 B1 | 7/2007 | Motoyama |
| 7,249,865 B2 | 7/2007 | Robertson |
| D548,868 S | 8/2007 | Roberge et al. |
| 7,252,408 B2 | 8/2007 | Mazzochette et al. |
| 7,253,566 B2 | 8/2007 | Lys et al. |
| 7,255,457 B2 | 8/2007 | Ducharme et al. |
| 7,255,460 B2 | 8/2007 | Lee |
| 7,256,554 B2 | 8/2007 | Lys |
| 7,258,458 B2 | 8/2007 | Mochiachvili et al. |
| 7,258,467 B2 | 8/2007 | Saccomanno et al. |
| 7,259,528 B2 | 8/2007 | Pilz |
| 7,262,439 B2 | 8/2007 | Setlur et al. |
| 7,264,372 B2 | 9/2007 | Maglica |
| 7,267,467 B2 | 9/2007 | Wu et al. |
| 7,270,443 B2 | 9/2007 | Kurtz et al. |
| 7,271,794 B1 | 9/2007 | Cheng et al. |
| 7,273,300 B2 | 9/2007 | Mrakovich |
| 7,274,045 B2 | 9/2007 | Chandran et al. |
| 7,274,160 B2 | 9/2007 | Mueller et al. |
| D553,267 S | 10/2007 | Yuen |
| 7,285,801 B2 | 10/2007 | Eliashevich et al. |
| 7,288,902 B1 | 10/2007 | Melanson |
| 7,296,912 B2 | 11/2007 | Beauchamp |
| 7,300,184 B2 | 11/2007 | Ichikawa et al. |
| 7,300,192 B2 | 11/2007 | Mueller et al. |
| D556,937 S | 12/2007 | Ly |
| D557,854 S | 12/2007 | Lewis |
| 7,303,300 B2 | 12/2007 | Dowling et al. |
| 7,306,353 B2 | 12/2007 | Popovich et al. |
| 7,307,391 B2 | 12/2007 | Shan |
| 7,308,296 B2 | 12/2007 | Lys et al. |
| 7,309,965 B2 | 12/2007 | Dowling et al. |
| 7,318,658 B2 | 1/2008 | Wang et al. |
| 7,319,244 B2 | 1/2008 | Liu et al. |
| 7,319,246 B2 | 1/2008 | Soules et al. |
| 7,321,191 B2 | 1/2008 | Setlur et al. |
| 7,326,964 B2 | 2/2008 | Lim et al. |
| 7,327,281 B2 | 2/2008 | Hutchison |
| 7,329,031 B2 | 2/2008 | Liaw et al. |
| D563,589 S | 3/2008 | Hariri et al. |
| 7,345,320 B2 | 3/2008 | Dahm |
| 7,348,604 B2 | 3/2008 | Matheson |
| 7,350,936 B2 | 4/2008 | Ducharme et al. |
| 7,350,952 B2 | 4/2008 | Nishigaki |
| 7,352,138 B2 | 4/2008 | Lys et al. |
| 7,352,339 B2 | 4/2008 | Morgan et al. |
| 7,353,071 B2 | 4/2008 | Blackwell et al. |
| 7,358,679 B2 | 4/2008 | Lys et al. |

(56) References Cited

U.S. PATENT DOCUMENTS

| | | |
|---|---|---|
| 7,358,929 B2 | 4/2008 | Mueller et al. |
| 7,374,327 B2 | 5/2008 | Schexnaider |
| 7,385,359 B2 | 6/2008 | Dowling et al. |
| 7,391,159 B2 | 6/2008 | Harwood |
| 7,396,146 B2 | 7/2008 | Wang |
| 7,401,935 B2 | 7/2008 | VanderSchuit |
| 7,401,945 B2 | 7/2008 | Zhang |
| 7,427,840 B2 | 9/2008 | Morgan et al. |
| 7,429,117 B2 | 9/2008 | Pohlert et al. |
| 7,434,964 B1 | 10/2008 | Zheng et al. |
| 7,438,441 B2 | 10/2008 | Sun et al. |
| D580,089 S | 11/2008 | Ly et al. |
| D581,556 S | 11/2008 | To et al. |
| 7,449,847 B2 | 11/2008 | Schanberger et al. |
| D582,577 S | 12/2008 | Yuen |
| 7,470,046 B2 * | 12/2008 | Kao et al. ............ 362/332 |
| D584,428 S | 1/2009 | Li et al. |
| 7,476,002 B2 | 1/2009 | Wolf et al. |
| 7,476,004 B2 | 1/2009 | Chan |
| 7,478,924 B2 | 1/2009 | Robertson |
| D586,484 S | 2/2009 | Liu et al. |
| D586,928 S | 2/2009 | Liu et al. |
| 7,490,957 B2 | 2/2009 | Leong et al. |
| 7,497,596 B2 | 3/2009 | Ge |
| 7,507,001 B2 | 3/2009 | Kit |
| 7,510,299 B2 | 3/2009 | Timmermans et al. |
| 7,520,635 B2 | 4/2009 | Wolf et al. |
| 7,521,872 B2 | 4/2009 | Bruning |
| 7,524,089 B2 | 4/2009 | Park |
| D592,766 S | 5/2009 | Zhu et al. |
| D593,223 S | 5/2009 | Komar |
| 7,534,002 B2 | 5/2009 | Yamaguchi et al. |
| 7,549,769 B2 | 6/2009 | Kim et al. |
| 7,556,396 B2 | 7/2009 | Kuo et al. |
| 7,572,030 B2 | 8/2009 | Booth et al. |
| 7,575,339 B2 | 8/2009 | Hung |
| 7,579,786 B2 | 8/2009 | Soos |
| 7,583,035 B2 | 9/2009 | Shteynberg et al. |
| 7,602,559 B2 | 10/2009 | Jang et al. |
| 7,619,366 B2 | 11/2009 | Diederiks |
| 7,635,201 B2 | 12/2009 | Deng |
| 7,639,517 B2 | 12/2009 | Zhou et al. |
| D612,528 S | 3/2010 | McGrath et al. |
| 7,690,813 B2 | 4/2010 | Kanamori et al. |
| 7,710,047 B2 | 5/2010 | Shteynberg et al. |
| 7,712,918 B2 | 5/2010 | Siemiet et al. |
| 7,828,471 B2 | 11/2010 | Lin |
| 7,843,150 B2 | 11/2010 | Wang et al. |
| 2001/0033488 A1 | 10/2001 | Chliwnyj et al. |
| 2001/0045803 A1 | 11/2001 | Cencur |
| 2002/0038157 A1 | 3/2002 | Dowling et al. |
| 2002/0044066 A1 | 4/2002 | Dowling et al. |
| 2002/0047569 A1 | 4/2002 | Dowling et al. |
| 2002/0047624 A1 | 4/2002 | Stam et al. |
| 2002/0047628 A1 | 4/2002 | Morgan et al. |
| 2002/0048169 A1 | 4/2002 | Dowling et al. |
| 2002/0057061 A1 | 5/2002 | Mueller et al. |
| 2002/0060526 A1 | 5/2002 | Timmermans et al. |
| 2002/0070688 A1 | 6/2002 | Dowling et al. |
| 2002/0074559 A1 | 6/2002 | Dowling et al. |
| 2002/0078221 A1 | 6/2002 | Blackwell et al. |
| 2002/0101197 A1 | 8/2002 | Lys et al. |
| 2002/0113555 A1 | 8/2002 | Lys et al. |
| 2002/0130627 A1 | 9/2002 | Morgan et al. |
| 2002/0145394 A1 | 10/2002 | Morgan et al. |
| 2002/0145869 A1 | 10/2002 | Dowling |
| 2002/0152045 A1 | 10/2002 | Dowling et al. |
| 2002/0152298 A1 | 10/2002 | Kikta et al. |
| 2002/0153851 A1 | 10/2002 | Morgan et al. |
| 2002/0158583 A1 | 10/2002 | Lys et al. |
| 2002/0163316 A1 | 11/2002 | Lys et al. |
| 2002/0171365 A1 | 11/2002 | Morgan et al. |
| 2002/0171377 A1 | 11/2002 | Mueller et al. |
| 2002/0171378 A1 | 11/2002 | Morgan et al. |
| 2002/0176259 A1 | 11/2002 | Ducharme |
| 2002/0179816 A1 | 12/2002 | Haines et al. |
| 2002/0195975 A1 | 12/2002 | Schanberger et al. |
| 2003/0011538 A1 | 1/2003 | Lys et al. |
| 2003/0028260 A1 | 2/2003 | Blackwell |
| 2003/0031015 A1 | 2/2003 | Ishibashi |
| 2003/0057884 A1 | 3/2003 | Dowling et al. |
| 2003/0057886 A1 | 3/2003 | Lys et al. |
| 2003/0057887 A1 | 3/2003 | Dowling et al. |
| 2003/0057890 A1 | 3/2003 | Lys et al. |
| 2003/0076281 A1 | 4/2003 | Morgan et al. |
| 2003/0085710 A1 | 5/2003 | Bourgault et al. |
| 2003/0095404 A1 | 5/2003 | Becks et al. |
| 2003/0100837 A1 | 5/2003 | Lys et al. |
| 2003/0102810 A1 | 6/2003 | Cross et al. |
| 2003/0133292 A1 | 7/2003 | Mueller et al. |
| 2003/0137258 A1 | 7/2003 | Piepgras et al. |
| 2003/0185005 A1 | 10/2003 | Sommers et al. |
| 2003/0185014 A1 | 10/2003 | Gloisten |
| 2003/0189412 A1 | 10/2003 | Cunningham |
| 2003/0222587 A1 | 12/2003 | Dowling, Jr. et al. |
| 2004/0003545 A1 | 1/2004 | Gillespie |
| 2004/0012959 A1 | 1/2004 | Robertson et al. |
| 2004/0036006 A1 | 2/2004 | Dowling |
| 2004/0037088 A1 | 2/2004 | English et al. |
| 2004/0052076 A1 | 3/2004 | Mueller et al. |
| 2004/0062041 A1 | 4/2004 | Cross et al. |
| 2004/0075572 A1 | 4/2004 | Buschmann et al. |
| 2004/0080960 A1 | 4/2004 | Wu |
| 2004/0090191 A1 | 5/2004 | Mueller et al. |
| 2004/0090787 A1 | 5/2004 | Dowling et al. |
| 2004/0105261 A1 | 6/2004 | Ducharme et al. |
| 2004/0105264 A1 | 6/2004 | Spero |
| 2004/0113568 A1 | 6/2004 | Dowling et al. |
| 2004/0116039 A1 | 6/2004 | Mueller et al. |
| 2004/0124782 A1 | 7/2004 | Yu |
| 2004/0130909 A1 | 7/2004 | Mueller et al. |
| 2004/0141321 A1 | 7/2004 | Dowling et al. |
| 2004/0155609 A1 | 8/2004 | Lys et al. |
| 2004/0160199 A1 | 8/2004 | Morgan et al. |
| 2004/0178751 A1 | 9/2004 | Mueller et al. |
| 2004/0189218 A1 | 9/2004 | Leong et al. |
| 2004/0189262 A1 | 9/2004 | McGrath |
| 2004/0212320 A1 | 10/2004 | Dowling et al. |
| 2004/0212321 A1 | 10/2004 | Lys et al. |
| 2004/0212993 A1 | 10/2004 | Morgan et al. |
| 2004/0223328 A1 | 11/2004 | Lee et al. |
| 2004/0240890 A1 | 12/2004 | Lys et al. |
| 2004/0257007 A1 | 12/2004 | Lys et al. |
| 2005/0013133 A1 | 1/2005 | Yeh |
| 2005/0024877 A1 | 2/2005 | Frederick |
| 2005/0030744 A1 | 2/2005 | Ducharme et al. |
| 2005/0035728 A1 | 2/2005 | Schanberger et al. |
| 2005/0036300 A1 | 2/2005 | Dowling et al. |
| 2005/0040774 A1 | 2/2005 | Mueller et al. |
| 2005/0041161 A1 | 2/2005 | Dowling et al. |
| 2005/0041424 A1 | 2/2005 | Ducharme |
| 2005/0043907 A1 | 2/2005 | Eckel et al. |
| 2005/0044617 A1 | 3/2005 | Mueller et al. |
| 2005/0047132 A1 | 3/2005 | Dowling et al. |
| 2005/0047134 A1 | 3/2005 | Mueller et al. |
| 2005/0062440 A1 | 3/2005 | Lys et al. |
| 2005/0063194 A1 | 3/2005 | Lys et al. |
| 2005/0078477 A1 | 4/2005 | Lo |
| 2005/0099824 A1 | 5/2005 | Dowling et al. |
| 2005/0107694 A1 | 5/2005 | Jansen et al. |
| 2005/0110384 A1 | 5/2005 | Peterson |
| 2005/0116667 A1 | 6/2005 | Mueller et al. |
| 2005/0128751 A1 | 6/2005 | Roberge et al. |
| 2005/0141225 A1 | 6/2005 | Striebel |
| 2005/0151489 A1 | 7/2005 | Lys et al. |
| 2005/0151663 A1 | 7/2005 | Tanguay |
| 2005/0154494 A1 | 7/2005 | Ahmed |
| 2005/0174473 A1 | 8/2005 | Morgan et al. |
| 2005/0174780 A1 | 8/2005 | Park |
| 2005/0184667 A1 | 8/2005 | Sturman et al. |
| 2005/0201112 A1 | 9/2005 | Machi et al. |
| 2005/0206529 A1 | 9/2005 | St.-Germain |
| 2005/0213320 A1 | 9/2005 | Kazuhiro et al. |
| 2005/0213352 A1 | 9/2005 | Lys |

(56) References Cited

U.S. PATENT DOCUMENTS

| | | |
|---|---|---|
| 2005/0213353 A1 | 9/2005 | Lys |
| 2005/0218838 A1 | 10/2005 | Lys |
| 2005/0218870 A1 | 10/2005 | Lys |
| 2005/0219860 A1 | 10/2005 | Schexnaider |
| 2005/0219872 A1 | 10/2005 | Lys |
| 2005/0225979 A1 | 10/2005 | Robertson et al. |
| 2005/0231133 A1 | 10/2005 | Lys |
| 2005/0236029 A1 | 10/2005 | Dowling |
| 2005/0236998 A1 | 10/2005 | Mueller et al. |
| 2005/0243577 A1* | 11/2005 | Moon ............ 362/612 |
| 2005/0248299 A1 | 11/2005 | Chemel et al. |
| 2005/0253533 A1 | 11/2005 | Lys et al. |
| 2005/0259424 A1 | 11/2005 | Zampini, II et al. |
| 2005/0265019 A1 | 12/2005 | Sommers et al. |
| 2005/0275626 A1 | 12/2005 | Mueller et al. |
| 2005/0276051 A1 | 12/2005 | Caudle et al. |
| 2005/0276053 A1 | 12/2005 | Nortrup et al. |
| 2005/0276064 A1 | 12/2005 | Wu et al. |
| 2005/0285547 A1 | 12/2005 | Piepgras et al. |
| 2006/0002110 A1 | 1/2006 | Dowling et al. |
| 2006/0012987 A9 | 1/2006 | Ducharme et al. |
| 2006/0012997 A1 | 1/2006 | Catalano et al. |
| 2006/0016960 A1 | 1/2006 | Morgan et al. |
| 2006/0022214 A1 | 2/2006 | Morgan et al. |
| 2006/0028155 A1 | 2/2006 | Young |
| 2006/0028837 A1 | 2/2006 | Mrakovich |
| 2006/0034078 A1 | 2/2006 | Kovacik et al. |
| 2006/0050509 A9 | 3/2006 | Dowling et al. |
| 2006/0050514 A1 | 3/2006 | Opolka |
| 2006/0076908 A1 | 4/2006 | Morgan et al. |
| 2006/0081863 A1* | 4/2006 | Kim et al. ............ 257/98 |
| 2006/0092640 A1 | 5/2006 | Li |
| 2006/0098077 A1 | 5/2006 | Dowling |
| 2006/0104058 A1 | 5/2006 | Chemel et al. |
| 2006/0109648 A1 | 5/2006 | Trenchard et al. |
| 2006/0109649 A1 | 5/2006 | Ducharme et al. |
| 2006/0109661 A1 | 5/2006 | Coushaine et al. |
| 2006/0126325 A1 | 6/2006 | Lefebvre et al. |
| 2006/0126338 A1 | 6/2006 | Mighetto |
| 2006/0132061 A1 | 6/2006 | McCormick et al. |
| 2006/0132323 A1 | 6/2006 | Grady, Jr. |
| 2006/0146531 A1 | 7/2006 | Reo et al. |
| 2006/0152172 A9 | 7/2006 | Mueller et al. |
| 2006/0158881 A1 | 7/2006 | Dowling |
| 2006/0170376 A1 | 8/2006 | Piepgras et al. |
| 2006/0192502 A1 | 8/2006 | Brown et al. |
| 2006/0193131 A1 | 8/2006 | McGrath et al. |
| 2006/0197661 A1 | 9/2006 | Tracy et al. |
| 2006/0198128 A1 | 9/2006 | Piepgras et al. |
| 2006/0208667 A1 | 9/2006 | Lys et al. |
| 2006/0221606 A1 | 10/2006 | Dowling et al. |
| 2006/0221619 A1 | 10/2006 | Nishigaki |
| 2006/0232974 A1 | 10/2006 | Lee et al. |
| 2006/0238884 A1* | 10/2006 | Jang et al. ............ 359/653 |
| 2006/0262516 A9 | 11/2006 | Dowling et al. |
| 2006/0262521 A1 | 11/2006 | Piepgras et al. |
| 2006/0262544 A1 | 11/2006 | Piepgras et al. |
| 2006/0262545 A1 | 11/2006 | Piepgras et al. |
| 2006/0273741 A1 | 12/2006 | Stalker, III |
| 2006/0274529 A1 | 12/2006 | Cao |
| 2006/0285325 A1 | 12/2006 | Ducharme et al. |
| 2007/0035255 A1 | 2/2007 | Shuster et al. |
| 2007/0040516 A1 | 2/2007 | Chen |
| 2007/0041220 A1 | 2/2007 | Lynch |
| 2007/0047227 A1 | 3/2007 | Ducharme |
| 2007/0053182 A1 | 3/2007 | Robertson |
| 2007/0053208 A1 | 3/2007 | Justel et al. |
| 2007/0064419 A1 | 3/2007 | Gandhi |
| 2007/0070621 A1 | 3/2007 | Rivas et al. |
| 2007/0070631 A1 | 3/2007 | Huang et al. |
| 2007/0081423 A1 | 4/2007 | Chien |
| 2007/0086754 A1 | 4/2007 | Lys et al. |
| 2007/0086912 A1 | 4/2007 | Dowling et al. |
| 2007/0097678 A1 | 5/2007 | Yang |
| 2007/0109763 A1 | 5/2007 | Wolf et al. |
| 2007/0115658 A1 | 5/2007 | Mueller et al. |
| 2007/0115665 A1 | 5/2007 | Mueller et al. |
| 2007/0120594 A1 | 5/2007 | Balakrishnan et al. |
| 2007/0127234 A1 | 6/2007 | Jervey |
| 2007/0133202 A1 | 6/2007 | Huang et al. |
| 2007/0139938 A1 | 6/2007 | Petroski et al. |
| 2007/0145915 A1 | 6/2007 | Roberge et al. |
| 2007/0147046 A1 | 6/2007 | Arik et al. |
| 2007/0152797 A1 | 7/2007 | Chemel et al. |
| 2007/0153514 A1 | 7/2007 | Dowling et al. |
| 2007/0159828 A1 | 7/2007 | Wang |
| 2007/0165402 A1 | 7/2007 | Weaver, Jr. et al. |
| 2007/0173978 A1 | 7/2007 | Fein et al. |
| 2007/0177382 A1 | 8/2007 | Pritchard et al. |
| 2007/0182387 A1 | 8/2007 | Weirich |
| 2007/0188114 A1 | 8/2007 | Lys et al. |
| 2007/0188427 A1 | 8/2007 | Lys et al. |
| 2007/0189026 A1 | 8/2007 | Chemel et al. |
| 2007/0195526 A1 | 8/2007 | Dowling et al. |
| 2007/0195527 A1 | 8/2007 | Russell |
| 2007/0195532 A1 | 8/2007 | Reisenauer et al. |
| 2007/0205712 A1 | 9/2007 | Radkov et al. |
| 2007/0206375 A1 | 9/2007 | Piepgras et al. |
| 2007/0211463 A1 | 9/2007 | Chevalier et al. |
| 2007/0228999 A1 | 10/2007 | Kit |
| 2007/0235751 A1 | 10/2007 | Radkov et al. |
| 2007/0236156 A1 | 10/2007 | Lys et al. |
| 2007/0237284 A1 | 10/2007 | Lys et al. |
| 2007/0240346 A1 | 10/2007 | Li et al. |
| 2007/0241657 A1 | 10/2007 | Radkov et al. |
| 2007/0242466 A1* | 10/2007 | Wu et al. ............ 362/362 |
| 2007/0247842 A1 | 10/2007 | Zampini et al. |
| 2007/0247847 A1 | 10/2007 | Villard |
| 2007/0247851 A1 | 10/2007 | Villard |
| 2007/0258231 A1 | 11/2007 | Koerner et al. |
| 2007/0258240 A1 | 11/2007 | Ducharme et al. |
| 2007/0263379 A1 | 11/2007 | Dowling |
| 2007/0274070 A1 | 11/2007 | Wedell |
| 2007/0281520 A1 | 12/2007 | Insalaco et al. |
| 2007/0285926 A1 | 12/2007 | Maxik |
| 2007/0285933 A1 | 12/2007 | Southard et al. |
| 2007/0290625 A1 | 12/2007 | He et al. |
| 2007/0291483 A1 | 12/2007 | Lys |
| 2007/0296350 A1 | 12/2007 | Maxik et al. |
| 2008/0003664 A1 | 1/2008 | Tysoe et al. |
| 2008/0007945 A1 | 1/2008 | Kelly et al. |
| 2008/0012502 A1 | 1/2008 | Lys |
| 2008/0012506 A1 | 1/2008 | Mueller et al. |
| 2008/0013316 A1 | 1/2008 | Chiang |
| 2008/0013324 A1 | 1/2008 | Yu |
| 2008/0018261 A1 | 1/2008 | Kastner |
| 2008/0037245 A1 | 2/2008 | Chan |
| 2008/0037284 A1 | 2/2008 | Rudisill |
| 2008/0062680 A1 | 3/2008 | Timmermans et al. |
| 2008/0089075 A1 | 4/2008 | Hsu |
| 2008/0092800 A1 | 4/2008 | Smith et al. |
| 2008/0093615 A1 | 4/2008 | Lin et al. |
| 2008/0093998 A1 | 4/2008 | Dennery et al. |
| 2008/0094837 A1 | 4/2008 | Dobbins et al. |
| 2008/0130267 A1 | 6/2008 | Dowling et al. |
| 2008/0151535 A1 | 6/2008 | de Castris |
| 2008/0158871 A1 | 7/2008 | McAvoy et al. |
| 2008/0158887 A1 | 7/2008 | Zhu et al. |
| 2008/0164826 A1 | 7/2008 | Lys |
| 2008/0164827 A1 | 7/2008 | Lys |
| 2008/0164854 A1 | 7/2008 | Lys |
| 2008/0175003 A1 | 7/2008 | Tsou et al. |
| 2008/0180036 A1 | 7/2008 | Garrity et al. |
| 2008/0186704 A1 | 8/2008 | Chou et al. |
| 2008/0192436 A1 | 8/2008 | Peng et al. |
| 2008/0211419 A1 | 9/2008 | Garrity |
| 2008/0224629 A1 | 9/2008 | Melanson |
| 2008/0224636 A1 | 9/2008 | Melanson |
| 2008/0253125 A1 | 10/2008 | Kang et al. |
| 2008/0258647 A1 | 10/2008 | Scianna |
| 2008/0285257 A1 | 11/2008 | King |
| 2008/0285266 A1 | 11/2008 | Thomas |
| 2008/0290814 A1 | 11/2008 | Leong et al. |
| 2008/0291675 A1 | 11/2008 | Lin et al. |

(56) References Cited

U.S. PATENT DOCUMENTS

| | | |
|---|---|---|
| 2008/0315773 A1 | 12/2008 | Pang |
| 2008/0315784 A1 | 12/2008 | Tseng |
| 2009/0002995 A1 | 1/2009 | Lee et al. |
| 2009/0016063 A1 | 1/2009 | Hu |
| 2009/0046473 A1 | 2/2009 | Tsai et al. |
| 2009/0052186 A1 | 2/2009 | Xue |
| 2009/0067170 A1* | 3/2009 | Bloemen et al. ............. 362/235 |
| 2009/0067182 A1 | 3/2009 | Hsu et al. |
| 2009/0086492 A1 | 4/2009 | Meyer |
| 2009/0091938 A1 | 4/2009 | Jacobson et al. |
| 2009/0140285 A1 | 6/2009 | Lin et al. |
| 2009/0175041 A1 | 7/2009 | Yuen et al. |
| 2009/0185373 A1 | 7/2009 | Grajcar |
| 2009/0195186 A1 | 8/2009 | Guest et al. |
| 2009/0196034 A1 | 8/2009 | Gherardini et al. |
| 2009/0213588 A1 | 8/2009 | Manes |
| 2009/0273926 A1 | 11/2009 | Deng |
| 2009/0303720 A1 | 12/2009 | McGrath |
| 2009/0316408 A1 | 12/2009 | Villard |
| 2010/0008085 A1 | 1/2010 | Ivey et al. |
| 2010/0019689 A1 | 1/2010 | Shan |
| 2010/0027259 A1 | 2/2010 | Simon et al. |
| 2010/0033095 A1 | 2/2010 | Sadwick |
| 2010/0033964 A1 | 2/2010 | Choi et al. |
| 2010/0096998 A1 | 4/2010 | Beers |
| 2010/0103664 A1 | 4/2010 | Simon et al. |
| 2010/0109550 A1 | 5/2010 | Huda et al. |
| 2010/0109558 A1 | 5/2010 | Chew |
| 2010/0164404 A1 | 7/2010 | Shao et al. |

FOREIGN PATENT DOCUMENTS

| | | |
|---|---|---|
| CN | 2869556 Y | 2/2007 |
| EP | 0013782 B1 | 3/1983 |
| EP | 0091172 A2 | 10/1983 |
| EP | 0124924 B1 | 9/1987 |
| EP | 0174699 B1 | 11/1988 |
| EP | 0197602 B1 | 11/1990 |
| EP | 0214701 B1 | 3/1992 |
| EP | 0262713 B1 | 6/1992 |
| EP | 0203668 B1 | 2/1993 |
| EP | 0272749 B1 | 8/1993 |
| EP | 0337567 B1 | 11/1993 |
| EP | 0390262 B1 | 12/1993 |
| EP | 0359329 B1 | 3/1994 |
| EP | 0403011 B1 | 4/1994 |
| EP | 0632511 A2 | 1/1995 |
| EP | 0432848 B1 | 4/1995 |
| EP | 0659531 A1 | 6/1995 |
| EP | 0403001 B1 | 8/1995 |
| EP | 0525876 B1 | 5/1996 |
| EP | 0714556 B1 | 1/1999 |
| EP | 0458408 B1 | 9/1999 |
| EP | 0578302 B1 | 9/1999 |
| EP | 0723701 B1 | 1/2000 |
| EP | 0787419 B1 | 5/2001 |
| EP | 1195740 A2 | 4/2002 |
| EP | 1016062 B1 | 8/2002 |
| EP | 1195740 A3 | 1/2003 |
| EP | 1149510 B1 | 2/2003 |
| EP | 1056993 B1 | 3/2003 |
| EP | 0766436 B1 | 5/2003 |
| EP | 0924281 B1 | 5/2003 |
| EP | 0826167 B1 | 6/2003 |
| EP | 1147686 B1 | 1/2004 |
| EP | 1142452 B1 | 3/2004 |
| EP | 1145602 B1 | 3/2004 |
| EP | 1422975 A1 | 5/2004 |
| EP | 0890059 B1 | 6/2004 |
| EP | 1348319 B1 | 6/2005 |
| EP | 1037862 B1 | 7/2005 |
| EP | 1346609 B1 | 8/2005 |
| EP | 1321012 B1 | 12/2005 |
| EP | 1610593 A2 | 12/2005 |
| EP | 1415517 B1 | 5/2006 |
| EP | 1415518 B1 | 5/2006 |
| EP | 1438877 B1 | 5/2006 |
| EP | 1166604 B1 | 6/2006 |
| EP | 1479270 B1 | 7/2006 |
| EP | 1348318 B1 | 8/2006 |
| EP | 1399694 B1 | 8/2006 |
| EP | 1461980 B1 | 10/2006 |
| EP | 1110120 B1 | 4/2007 |
| EP | 1440604 B1 | 4/2007 |
| EP | 1047903 B1 | 6/2007 |
| EP | 1500307 B1 | 6/2007 |
| EP | 0922305 B1 | 8/2007 |
| EP | 0922306 B1 | 8/2007 |
| EP | 1194918 B1 | 8/2007 |
| EP | 1048085 B1 | 11/2007 |
| EP | 1763650 B1 | 12/2007 |
| EP | 1776722 B1 | 1/2008 |
| EP | 1459599 B1 | 2/2008 |
| EP | 1887836 A2 | 2/2008 |
| EP | 1579733 B1 | 4/2008 |
| EP | 1145282 B1 | 7/2008 |
| EP | 1157428 B1 | 9/2008 |
| EP | 1000522 B1 | 12/2008 |
| EP | 1502483 B1 | 12/2008 |
| EP | 1576858 B1 | 12/2008 |
| EP | 1646092 B1 | 1/2009 |
| EP | 1337784 B1 | 6/2009 |
| GB | 2215024 A | 9/1989 |
| GB | 2324901 A | 11/1998 |
| JP | 6-54103 U | 7/1994 |
| JP | H6-54103 | 7/1994 |
| JP | 7-249467 | 9/1995 |
| JP | 08-162677 | 6/1996 |
| JP | 11-135274 A | 5/1999 |
| JP | 2001-238272 A | 8/2001 |
| JP | 2002-141555 A | 5/2002 |
| JP | 2002141555 A | 5/2002 |
| JP | 3098271 U | 2/2004 |
| JP | 2004-335426 | 11/2004 |
| JP | 2005-158363 A | 6/2005 |
| JP | 2005-166617 A | 6/2005 |
| JP | 2005322866 A | 11/2005 |
| JP | 2005-347214 A | 12/2005 |
| JP | 2006-507641 A | 3/2006 |
| JP | 3139714 U | 2/2008 |
| JP | 2008-258124 A | 10/2008 |
| KR | 10-2004-0008244 A | 1/2004 |
| KR | 1020060112113 A | 10/2006 |
| KR | 20-0430022 Y1 | 11/2006 |
| KR | 1020060133784 A | 12/2006 |
| KR | 1020070063595 A | 6/2007 |
| KR | 10-0781652 B1 | 12/2007 |
| TW | M337036 | 7/2008 |
| WO | 9906759 A1 | 2/1999 |
| WO | 99/10867 A1 | 3/1999 |
| WO | 99/31560 A2 | 6/1999 |
| WO | 9945312 A1 | 9/1999 |
| WO | 9957945 A1 | 11/1999 |
| WO | 00/01067 A2 | 1/2000 |
| WO | 02/061330 A2 | 8/2002 |
| WO | 02/069306 A2 | 9/2002 |
| WO | 02/091805 A2 | 11/2002 |
| WO | 02/098182 A2 | 12/2002 |
| WO | 02/099780 A2 | 12/2002 |
| WO | 02/258482 A2 | 12/2002 |
| WO | 03/026358 A1 | 3/2003 |
| WO | 03/055273 A2 | 7/2003 |
| WO | 03/067934 A2 | 8/2003 |
| WO | 03/090890 A1 | 11/2003 |
| WO | 03/096761 A1 | 11/2003 |
| WO | 2004/021747 A2 | 3/2004 |
| WO | 2004/023850 A2 | 3/2004 |
| WO | 2004/032572 A2 | 4/2004 |
| WO | 2004/100624 A2 | 11/2004 |
| WO | 2005031860 A2 | 4/2005 |
| WO | 2005/052751 A2 | 6/2005 |
| WO | 2005/060309 A2 | 6/2005 |
| WO | 2005/084339 A2 | 9/2005 |

(56) References Cited

FOREIGN PATENT DOCUMENTS

| WO | 2005/089293 A2 | 9/2005 |
|---|---|---|
| WO | 2005/089309 A2 | 9/2005 |
| WO | 2006/023149 A2 | 3/2006 |
| WO | 2006044328 A1 | 4/2006 |
| WO | 2006056120 A1 | 6/2006 |
| WO | 2006/093889 A2 | 9/2006 |
| WO | 2006/127666 A2 | 11/2006 |
| WO | 2006/127785 A2 | 11/2006 |
| WO | 2006/133272 A2 | 12/2006 |
| WO | 2006137686 A1 | 12/2006 |
| WO | 2007/004679 A1 | 1/2007 |
| WO | 2007/081674 A1 | 7/2007 |
| WO | 2007/094810 A2 | 8/2007 |
| WO | 2007090292 A1 | 8/2007 |

OTHER PUBLICATIONS

Experiment Electronic Ballast. Electronic Ballast for Fluorescent Lamps [online], Revised Fall of 2007. [Retrieved on Sep. 1, 1997]. Retrieved from Virginia Tech Web Page using Internet <URL: http://www.ece.vt.edu/ece3354/labs/ballast.pdf.>.

Truck-Lite, LEDSelect-LED, Model 35, Clearance & Marker Lighting, [online], [retrieved on Jan. 13, 2000] Retrieved from Truck-Lite Web Page using Internet <URL: http://trucklite.com/leds14.html>.

Truck-Lite, LEDSelect-LED, Super 44, Stop, Turn & Tail Lighting, [online], [retrieved on Jan. 13, 2000] Retrieved from Truck-Lite Web Page using Internet <URL: http://trucklite.com/leds2.html>.

Truck-Lite, LEDSelect-LED, Model 45, Stop, Turn & Tail Lighting [online], [retrieved on Jan. 13, 2000] Retrieved from Truck-Lite Web Page using Internet <URL: http://trucklite.com/leds4.html>.

Telecite Products & Services—Display Options, [online], [retrieved on Jan. 13, 2000] Retrieved from Telecite Web page using Internet <URL: http;//www.telecite.com/en/products/options en.htm>.

Traffic Signal Products—Transportation Products Group, [online], [retrieved on Jan. 13, 2000] Retrieved from the Dialight Web Page using Internet <URL: http://www.dialight.com/trans.htm>.

LED Lights, Replacement LED lamps for any incandescent light, [online], [retrieved on Jan. 1, 2000] Retrieved from LED Lights Web Page using Internet <URL: http:www.ledlights.com/replac.htm>.

Ledtronics, Ledtronics Catalog, 1996, p. 10, LEDTRONICS, Torrance, California.

Piper. The Best Path to Efficiency. Building Operating Management, Trade Press Publishing Company May 2000 [online], [retrieved on Jan. 17, 2008]. Retrieved from Find Articles Web Page using Internet <URL:http://findarticles.com/p/articles/mi_qu3922/is_200005/ai_n8899499/>.

Henson, Keith. The Benefits of Building Systems Integration, Access Control & Security Systems Integration, Oct. 1, 2000, Penton Media. [online], [retrieved on Oct. 24, 2008] Retrieved from Security, Solutions Web page using Internet <URL: http://securitysolutions.com/mag/security_benefits_building_systems/>.

Phason Electronic Control Systems, Light Level Controller (LLC) case study Nov. 30, 2004. 3 pages, Phason Inc., Winnipeg, Manitoba, Canada.

Airport International. Fly High With Intelligent Airport Building and Security Solutions [online], [retrieved on Oct. 24, 2008]. Retrieved from Airport International web page using Internet <URL: http://www.airport-int.com/categories/airport-building-and-security-solutions/fly-high-with-intelligent-airport-building-and-security-solutions.html>.

D.N.A.-III, [online], [retrieved Mar. 10, 2009] Retrieved from the PLC Lighting Web Page Easing Internet <URL: http://www.piclighting.com/product_info.php?cPath=1&products_id=92>.

E20116-18 Larmes Collection, [online], [retrieved on Jul. 10, 2010] Retrieved from ET2 Contemporary Lighting using Internet <URL: http;//www.et2online.com/proddetail.aspx?ItemID=E20116-18>.

E20112-22 Starburst Collection, [online]. [retrieved on Jul. 10, 2010] Retrieved from ET2 Contemporary Lighting using Internet <URL: http:www.et2online com/proddetail.aspx?ItemID=E20112-22>.

E20524-10 & E20525-10 Curve Collection, [online], [retrieved on Jul. 10, 2010] Retrieved from ET2 Contemporary Lighting using Internet <URL: http://www.et2online.com/proddetail.aspx?ItemID=E20524-10 & E20525-10>.

E22201-44 Esprit Collection, [online], [retrieved on Jul. 10, 2010] Retrieved from ET2 Contemporary Lighting using Internet <URL: http://www.et2online.com/proddetial.aspx?ItemID=E22201-44>.

E20743-09 Stealth Collection [online], [retrieved on Jul. 10, 2010] Retrieved from ET2 Contemporary Lighting using Internet <URL: http://www.et2online.com/proddetail.aspx?ItemID=E20743-09>.

Spencer, Eugene. High Sales, Low Utilization. Green Intelligent Buildings, Feb. 1, 2007. [online]. Retrieved from Green Intelligent Buildings web page using Internet <URL: http;//www.greenintelligentbuildings.com/CDA/IBT_Archive/BNP_GUID_9-5-2006_A_10000000000000056772>.

Sensor Switch, nLight Lighting Control System, [online], [retrieved on Jan. 11, 2008] Retrieved from Sensor Switch web page using Internet <URL: http://www.sensorswitch com>.

Six Strategies, [online], [retrieved on Jan. 11, 2008] Retrieved from Encelium Technologies Inc. Web Page using Internet <URL: http://www.encelium.com/products/strategies.html>.

Lawrence Berkeley National Labratory, Lighting Control System—Phase Cut Carrier. University of California, [online] [retrieved on Jan. 14, 2008] Retrieved from Lawrence Berkeley National Labratory web page using Internet <URL: http://www.lbl.gov/tt/tects/lbnl1871.html>.

Best Practice Guide—Commercial Office Buildings—Central HVAC System. [online], [Retrieved on Jan. 17, 2008] Retrieved from Flex Your Power Organization web page using Internet <URL: http://www.fypower.org/bpg/module.html?b=offices&m+Central HVAC Systems&s=Contr . . . >.

Cornell University. Light Canopy—Cornell University Solar Decathlon. [online], [retrieved on Jan. 17, 2008] Retrieved from Cornell University web page using Internet <URL: http://cusd.cornell.edu/cusd/web/index.php/page/show/section/Design/page/controls>.

Written Opinion and International Search Report of the International Search Authority Aug. 16, 2010 from the corresponding International Application No. PCT/US2010/021131 filed Jan. 15, 2010.

Notification of transmittal, International Search Report, and the Written Opinion dated Aug. 16, 2010 from the corresponding International Application No. PCT/US2010/021131 filed Jan. 15, 2010.

Extended European Search Report for co-pending European Apllication No. 10 73 2124 mailed on Dec. 13, 2012 in 8 pages.

* cited by examiner

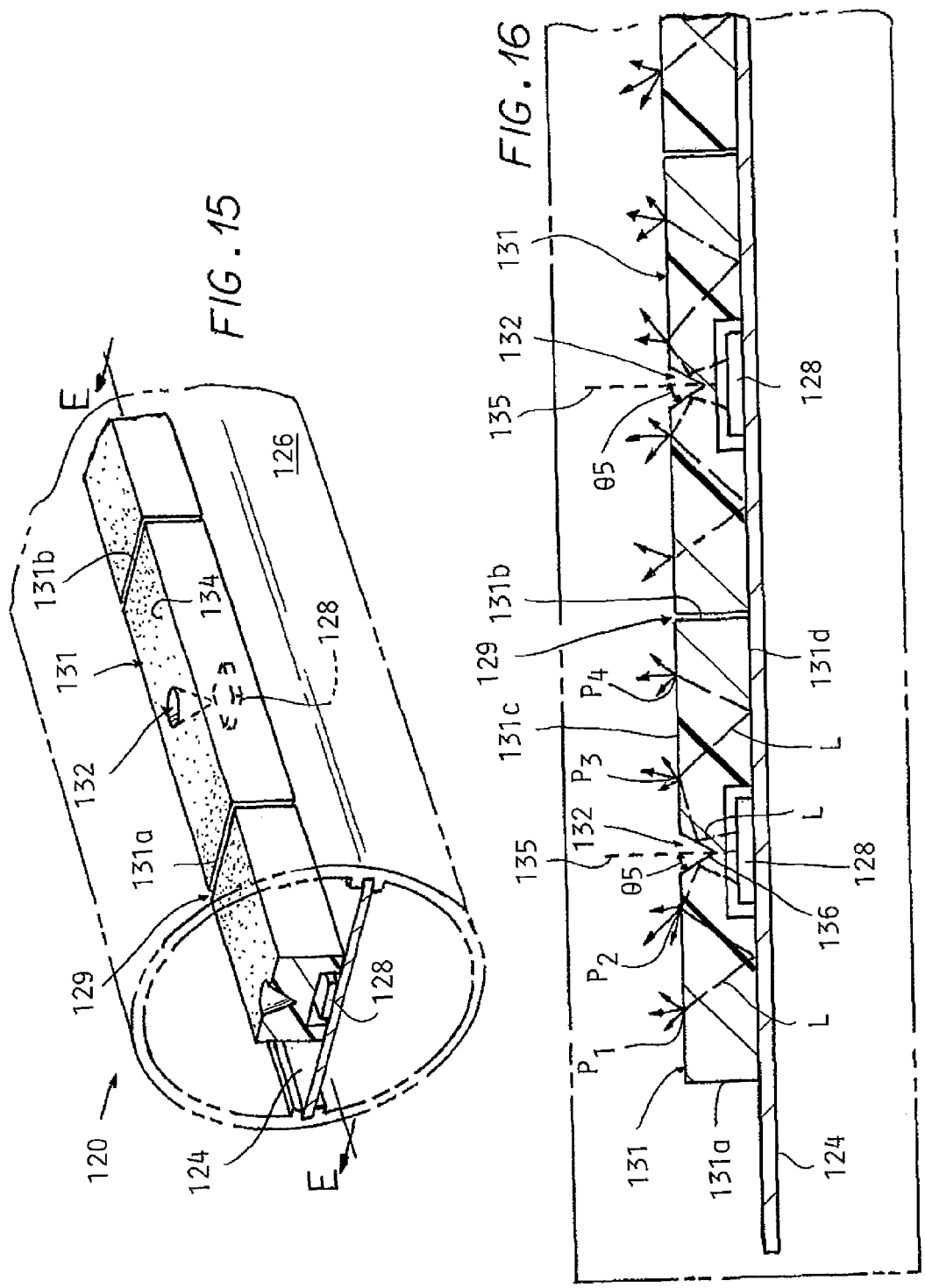

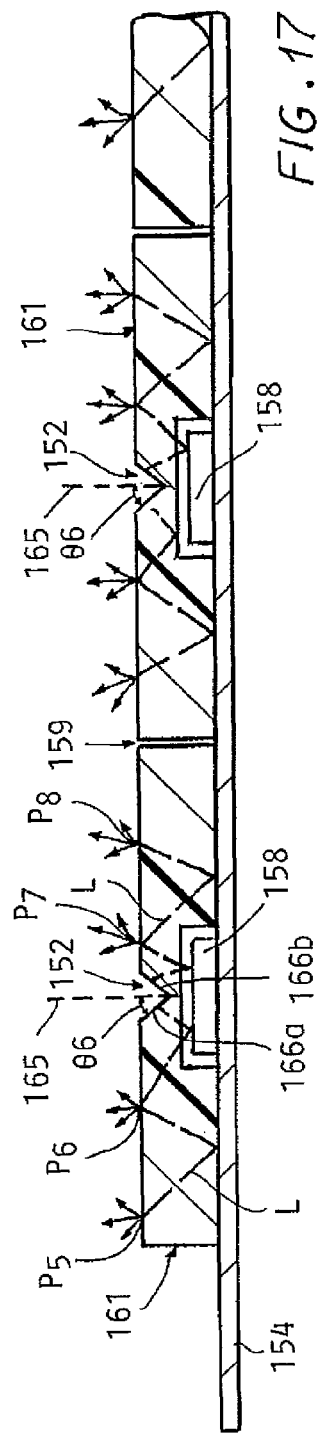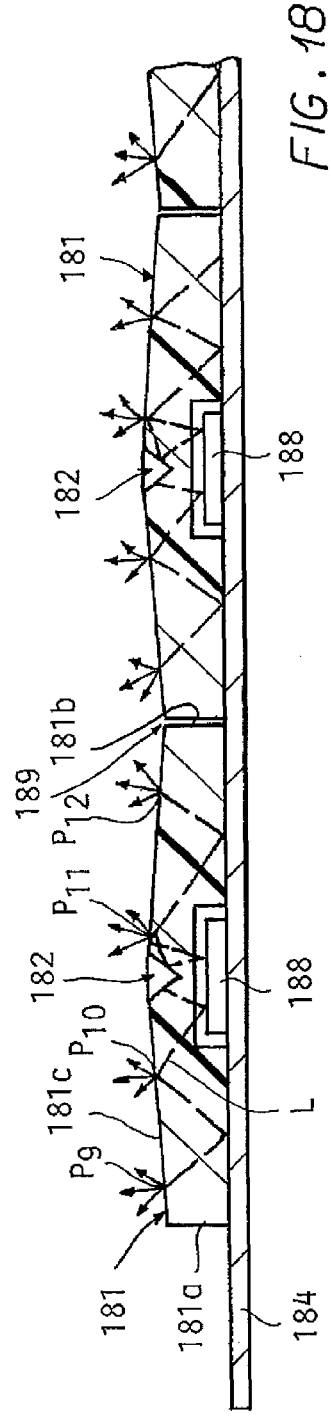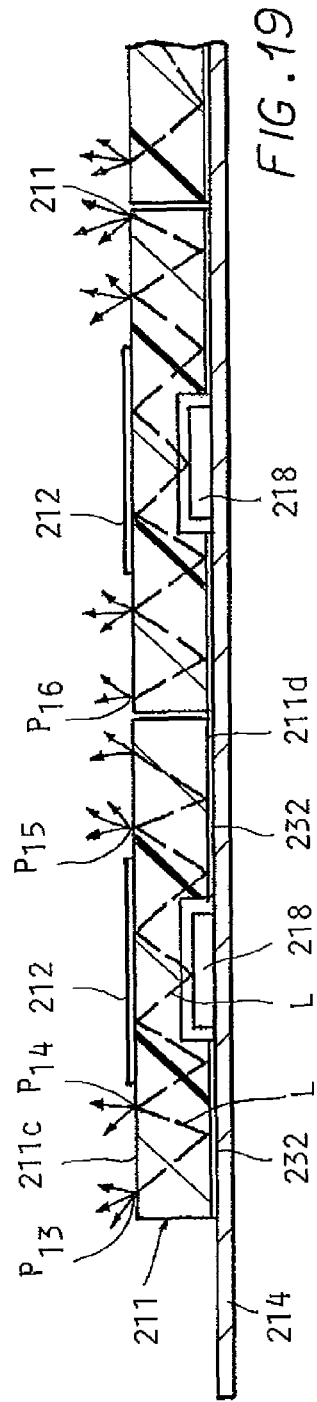

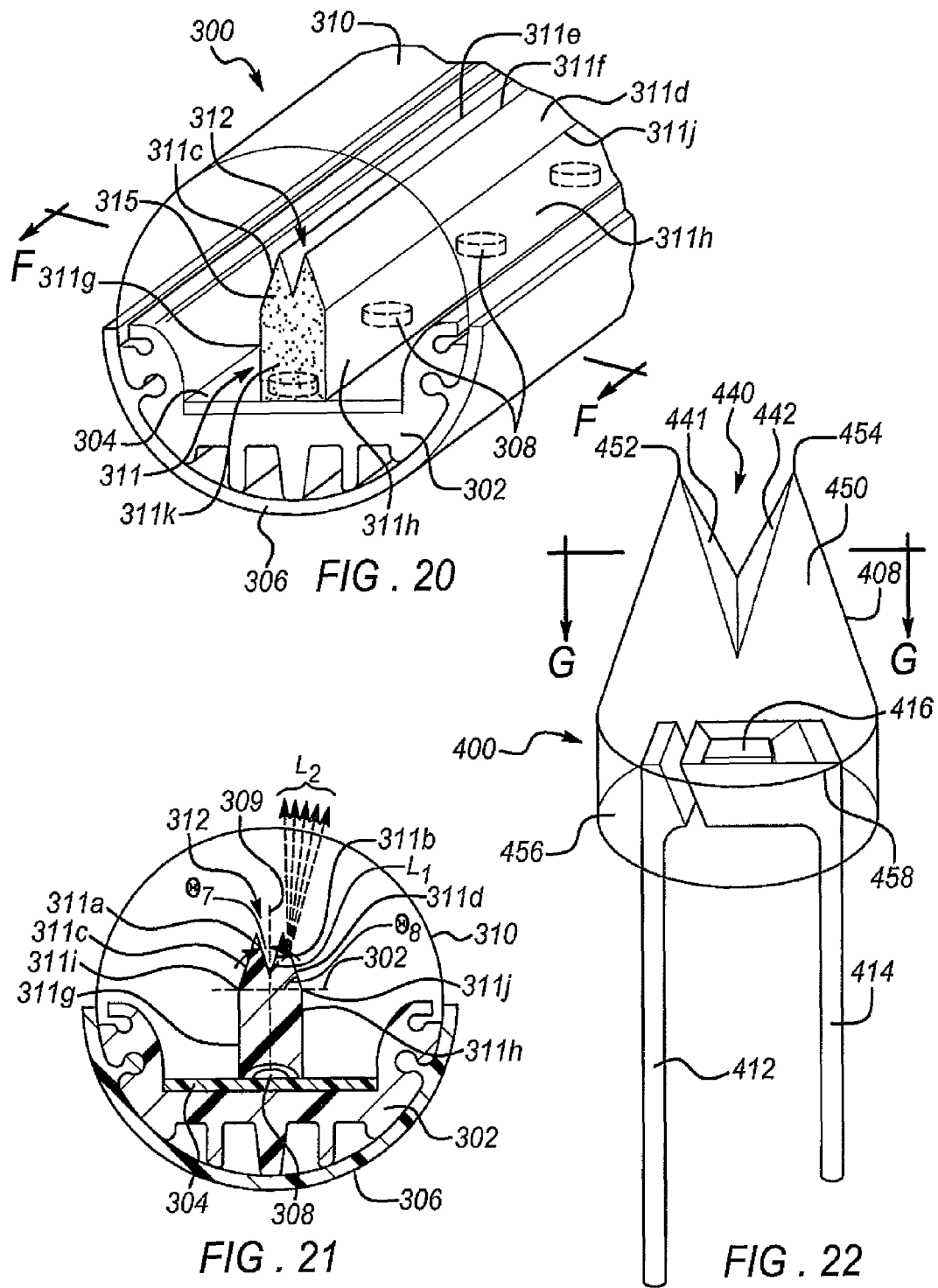

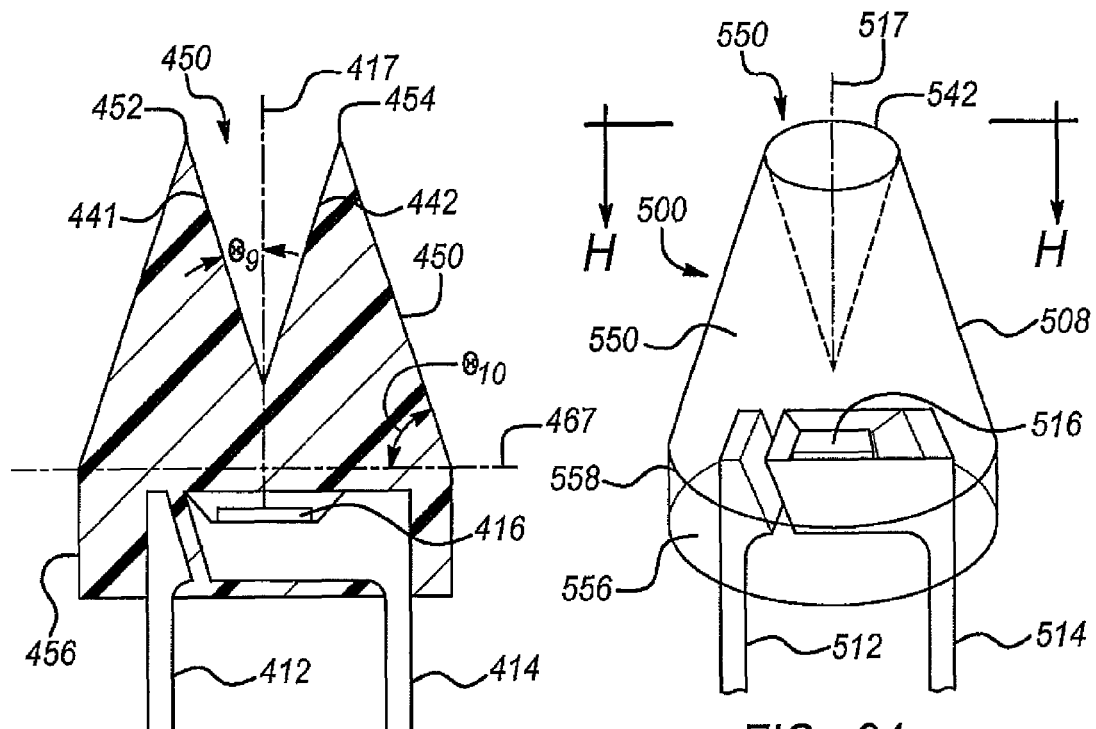
FIG. 23
FIG. 24
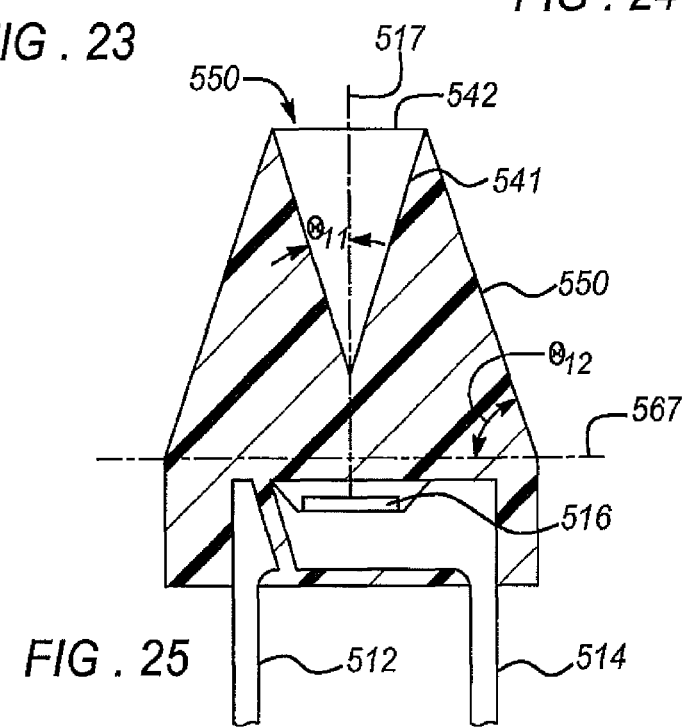
FIG. 25

LED LENS

CROSS-REFERENCE TO RELATED APPLICATION

This application claims priority from U.S. Provisional Patent Application No. 61/144,853, filed Jan. 15, 2009, the entire contents of which is incorporated herein by reference.

TECHNICAL FIELD

The present invention relates to a lens for an LED.

BACKGROUND

Light emitting diodes (LEDs) have many advantages over fluorescent tubes. LEDs are more efficient, last longer, and are less sensitive to vibrations and low temperatures. To take advantage of the benefits of LEDs, LEDs are being included in lights of various shapes, such as in the shape of fluorescent tubes. However, known LEDs are constrained by the directional light output of the LEDs in contrast to, for example, the uniform non-directional light output of fluorescent tubes. One way of spreading the directional light output from an LED is to direct the light through a diffuser.

BRIEF SUMMARY

Known LEDs provide directional light output that may result in the appearance of bright spots of light. Thus, known lights in the shape of fluorescent tubes including LEDs, for example, may appear different from fluorescent tubes, which are characterized by their uniform light distribution.

A light modifier for an LED which produces light about a central axis is described herein. The light modifier can reduce the appearance of bright spots resulting from the directional light output of the LED. In one example of such a light modifier, a lens defines an indentation. The indentation is angled relative to the central axis by an amount less than a complementary angle of a critical angle of the lens along the indentation.

In another embodiment, a replacement light for a fluorescent tube usable in a fluorescent fixture is provided. The replacement light includes a support structure having a longitudinal axis. At least one LED is connected to the support structure, and the at least one LED produces light about respective central axes. At least one lens is positioned along the central axis of the at least one LED, and the lens defines an indentation angled relative to the central axis by an amount less than a complementary angle of a critical angle of the lens along the indentation. At least one electrical connector at a longitudinal end of the support structure is in electrical communication with the at least one LED.

In another embodiment, a method of forming a lens defining an indentation angled by an amount less than a complementary angle of a critical angle of the lens along the indentation relative to a central axis of light produced by an LED is provided. The method includes extruding material in an extrusion direction to form a sheet of greater width than the lens. The sheet has a same profile as the lens. The method also includes sectioning the sheet to form the lens.

In another embodiment, a replacement light for a fluorescent tube usable in a fluorescent fixture is provided. The replacement includes a support structure having a longitudinal axis. Multiple LEDs connected to the support structure, and the LEDs producing light about respective central axes. At least one light pipe is positioned along the central axis of one of the LEDs, and the light pipe has a reflector positioned over at least a portion of the LED such that the light initially emitted from the LED strikes the reflector. At least one electrical connector at a longitudinal end of the support structure is in electrical communication with the multiple LEDs.

These and other embodiments will be described in additional detail hereinafter.

BRIEF DESCRIPTION OF THE DRAWINGS

The description herein makes reference to the accompanying drawings wherein like reference numerals refer to like parts throughout the several views, and wherein:

FIG. 15 is a partial perspective view another tube shaped LED light according to the invention;

FIG. 16 is a cross section of the light shown in FIG. 15 along line E-E;

FIG. 17 is a cross section view of another tube shaped LED light according to the invention;

FIG. 18 is a cross section view of another tube shaped LED light according to the invention;

FIG. 19 is a cross section view of another tube shaped LED light according to the invention;

FIG. 20 is a partial perspective view another tube shaped LED light according to the invention;

FIG. 21 is a cross section of the light shown in FIG. 20 along line F-F;

FIG. 22 is a perspective view of another LED according to the invention;

FIG. 23 is a cross section along line G-G of the LED in FIG. 22;

FIG. 24 is a perspective view of another LED according to the invention;

FIG. 25 is a cross section along line H-H of the LED in FIG. 24;

DETAILED DESCRIPTION OF EMBODIMENTS OF THE INVENTION

Figure 1:
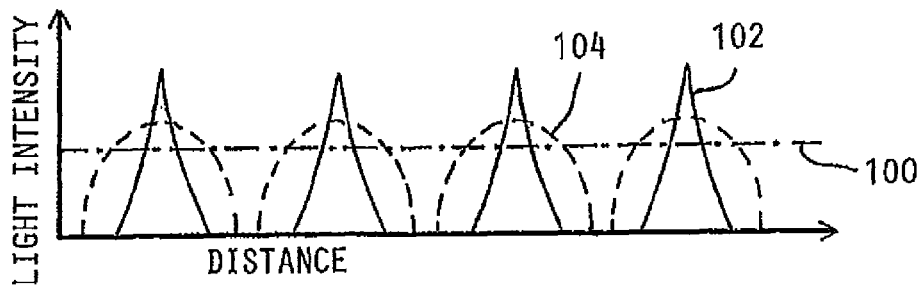
FIG. 1 is a graph showing light intensity distributions of multiple types of tube shaped lights.

Examples of lenses for use with LEDs are discussed below with reference to FIGS. 1-14. As shown in FIG. 1, a fluorescent tube produces a generally constant light intensity along its entire length, which is indicated by line 100. An LED, however, generally produces light in a Lambertian distribution, with a majority of the light within a few degrees of a central axis normal to the LED. The light concentrated around the central axis is referred to as a "bright spot," When LEDs are used in a fluorescent tube shaped light, the light can have the appearance of several bright spots. For example, line 102 in FIG. 1 includes four spikes, each of which represents the bright spot of light produced by an LED or a closely-spaced group of LEDs (e.g., a six-pack package of LEDs). A similar light distribution problem can exist when LEDs are used in other types of lights, such as LED-based flashlights and LED-based lights sized to replace incandescent bulbs.

Figure 2:
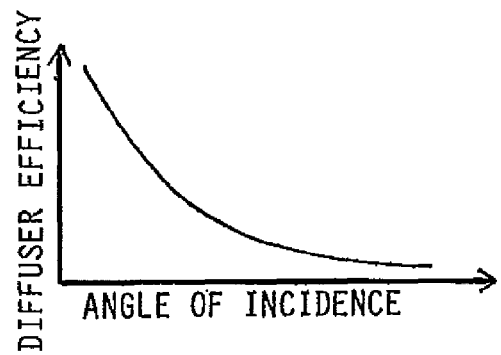
FIG. 2 is a graph showing an efficiency of a diffuser.

A diffuser can be placed in the path of light produced by an LED to reduce the appearance of bright spots. However, as shown by line 104 in FIG. 1, merely diffusing the light does not result in a light distribution that is sufficiently similar to the light distribution of a fluorescent tube for many consumers. This is in part because, as shown in FIG. 2, the efficiency of a diffuser generally decreases as the angle of incidence of light striking the diffuser (i.e., the angle between a beam of light and a line normal to the diffuser) increases. As a result, if light does not strike a diffuser at a low angle of incidence, there is a high probability the light will be reflected instead of diffused. One goal of using a diffuser is to spread light to dark areas between two adjacent LEDs. However, light travelling toward these dark spots may have a high angle of incidence relative to a diffuser. As a result, diffusion can be least efficient (i.e., reflecting light instead of diffusing it) in the area between two adjacent LEDs. Therefore, diffusers alone do not provide a light distribution that is sufficiently similar to the light distribution of a fluorescent tube for many consumers.

Figure 3:
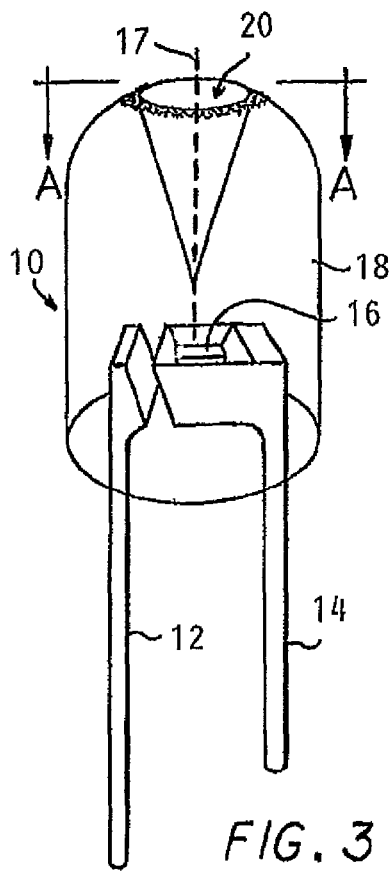
FIG. 3 is a perspective view of an example of an LED including a lens according to the invention.

FIG. 3 shows an example of an LED package 10 including electrical leads 12 and 14, an LED 16, and a lens 18. The LED 16 can be a single P-N junction, or the LED 16 can include multiple P-N junctions (e.g., a "six-pack" of P-N junctions). Multiple P-N junctions can be sufficiently closely spaced to be approximated as a single point source of light and will therefore be considered the same as a single point source of light for the purposes of this description. Also, the LED package 10 can include additional structures not shown, such as a reflector between the LED 16 and the lead 14 to reflect errant light, or a heat sink (e.g., if the LED is high powered or otherwise generates enough heat to warrant the heat sink).

The LED 16 can produce light in a Lambertian distribution centered about a central axis 17, which can extend normally to the LED 16. However, the LED 16 may also exhibit a different distribution of light, in which case the axis 17 can still represent at least one of a center point of the distribution of light and an axis normal to the LED 16. The LED 16 can be an LED of any power rating, e.g. 0.05 W, 0.10 W, 0.25 W, or a high power LED, such as a surface-mount LED of the type available from Nichia. Electrical connectors other than the illustrated leads 12 and 14 can be included depending on the type of LED 16 used. The LED 16 can produce a variety of wavelengths of light, such as white light, red light, blue light, or ultra-violet light.

The lens 18 can encase the LED 16 and can also encase portions of the leads 12 and 14 as shown in FIG. 3. The lens 18 can protect the LED 16 from the external environment to reduce corrosion or other damage to the LED 16. The lens 18 can be translucent or transparent and can be made from a light transmitting material such as polycarbonate, acrylic, or glass.

Figure 4:
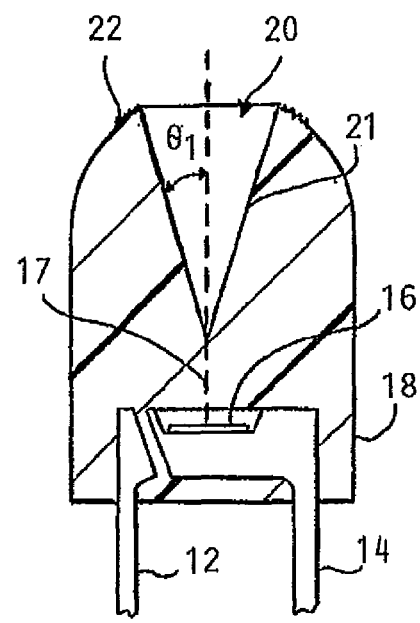
FIG. 4 is a cross section along line A-A of the LED in FIG. 3.

As best shown in FIG. 4, the lens 18 can define a conical indentation 20. The conical indentation 20 can be centered over the axis 17 of the LED 16, and the indentation 20 can have a diameter large enough to cover the bright spot of light produced by the LED 16. (Given that the term "bright spot" is subjective, the bright spot does not necessarily have a definite diameter. However, the size of the bright spot can be determined based on, for example, consumer opinion or a standardized objective consideration, e.g., an area through which a certain percentage of the light produced by the LED 16 passes.) While the indentation 20 should be large enough to cover the bright spot produced by the LED 16, the indentation 20 can itself produce a dark spot since light can be totally internally reflected by a continuous sidewall 21 of the conical indentation 20. As a result, the indentation 20 should not be greatly larger than the bright spot. Thus, a trade-off can exist in determining the size of the indentation 20 between reflecting light that would otherwise produce the bright spot and not creating too large of a dark spot. A way of mitigating the dark spot created by the indentation 20 is discussed below.

The conical indentation 20 can include sidewalls 21 angled relative to the central axis 17 such that light produced by the LED 16 that contacts the sidewall 21 is totally internally reflected, Since the critical angle for light contacting the sidewall 21 is measured from a line normal to the sidewall 21, the angle $\theta_1$ between the axis 17 and the sidewall 21 should be less than a complementary angle of the critical angle of the sidewall 21. For example, if the lens 18 is made from polycarbonate and air surrounds the LED package 10, the critical angle for light striking the sidewall 21 is approximately forty degrees. That is, if light strikes the sidewall 21 at an angle greater than forty degrees from a line normal to the lens 18, then the light will be totally internally reflected. Since the angle $\theta_1$ shown in FIG. 4 is measured from the sidewall 21, not normal to the sidewall 21, light is totally internally reflected if it strikes the sidewall 21 at an angle less than fifty degrees relative to the sidewall 21 (i.e., the complementary angle to the critical angle, forty degrees). Therefore, each sidewall 21 can be angled up to approximately fifty degrees relative to the axis 17 to achieve total internal reflection (TIR).

While the angle $\theta_1$ can be up to, in the example above, fifty degrees, the specific angle $\theta_1$ actually used can be selected based on the desired distribution of light. As the angle $\theta_1$ increases, the indentation 20 distributes light over a greater area radial of the axis 17, which may reduce the amount of light directed to an area to be illuminated. However, as the angle $\theta_1$ decreases, a greater amount of light is produced in the vicinity around the indentation 20, which can create the appearance of a bright halo of light around the indentation 20. Angling the sidewall 21 to produce a bright halo of light may allow a large amount of light to be directed toward a space to be illuminated while still reducing the appearance of bright spots.

Another consideration in selecting both the diameter of the indentation 20 and the angle $\theta_1$ is the depth of the indentation 20, since the depth is a function of the diameter and angle $\theta_1$. For example, the depth of the indentation 20 can be selected such that a tip of the indentation is near the LED 16 to reduce the distance light has to travel from the LED 16 before contacting the indentation 20, thereby reducing the likelihood that the light will be refracted by an imperfection in the lens 18 prior to contacting the indentation 20.

One way of determining an optimal indentation 20 diameter, sidewall 21 angle $\theta_1$, and indentation 20 depth is objectively through experimentation or calculation, with the size, angle $\theta_1$, and depth selected to obtain as even a distribution of light as possible (or some other distribution of light, if desired). For example, as shown in FIG. 4, the indentation 20 extends to adjacent the LED 16 and is angled approximately twenty degrees relative to the axis 17. Keeping the angle $\theta_1$ relatively small (e.g., between approximately fifteen and twenty five degrees) can produce the blight halo of light around the indentation 20.

As discussed earlier, diffusion is generally inefficient when the angle of incidence is large. However, the halo of light that can be produced around the indentation 20 can have a small angle of incidence relative to an annular portion of the lens 18 circumscribing the indentation 20. As a result, providing the lens 18 with a diffusing surface 22 around the indentation 20 can efficiently diffuse the bright halo of light. The diffusing surface 22 as shown includes surface roughening, though other diffusers such as a diffusing film can be used to produce diffusion. Alternatively, other portions of the lens 18 can include a diffusing surface. For example, the entire lens 18 other than the indentation 20 can include a diffuser.

Figure 5:
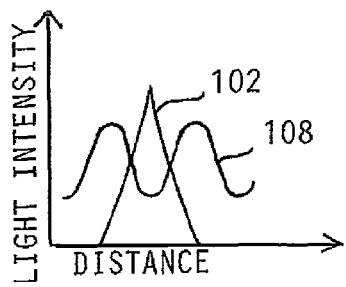
FIG. 5 is a graph showing a light intensity distribution of the LED of FIG. 3 compared to a known LED.

Diffusing the halo of light can reduce the appearance of a dark spot created by the indentation 20, and it can also lower the brightness of the halo to be more inline with the brightness of other portions of the lens 18. For example, as shown in FIG. 5, the LED package 10 can provide a distribution of light having two "peaks" with a "trough" between the peaks as indicated by line 108. The peaks can be created by the indentation 20, as it can direct light into the halo shape represented by the peaks. The indentation 20 can also cause the trough to appear between the peaks, since the indentation 20 can reflect light that would otherwise occupy the trough area. While TIR of light that contacts the sidewall 21 theoretically results in no light exiting the lens 18 through the indentation, the diffusing surface 22 can direct light that would otherwise add to the brightness of the halo to reduce the dark spot created by the indentation 20. That is, the diffusing surface 22 can decrease the difference between the height of the peaks and the depth of the trough. Further, the diffusing surface 22 can direct light that would otherwise add to the brightness of the halo radially away from the axis 17, increasing the light intensity of the areas outward of the peaks to further even out the distribution of light.

Thus, unlike many known LEDs which produce a blight spot represented by the spike shaped distribution indicated by line 102 in FIG. 5 for comparison, the LED package 10 can provide a relatively even distribution of light. The indentation 20 in the lens 18 can reduce the appearance of a bright spot by altering the distribution of light through the lens 18. The amount by which the bright spot of the known LED is reduced is illustrated as the distance between the top of the spiked shape distribution of the known LED and the top of one of the peaks of the light distribution of the LED package 10. Further, the distribution of the LED package 10 away from the LED 16 is more even than the distribution of light produced by the known LED, as the light distribution of the LED package 10 does not drop off when moving away from the LED 16 to the extent of the known LED.

Also, while the angle $\theta_1$ of the sidewall 21 relative to the axis 17 is described above as designed to achieve TIR, this is not intended to mean that every photon of light that contacts the sidewall 21 is reflected. Current manufacturing limitations make achieving 100% TIR difficult, as the sidewall 21 may not be perfectly smooth. Instead, the angle $\theta_1$ can be such that theoretically, without such imperfections, TIR is achieved. Also, the sidewall 21 can be made substantially smooth such that enough light is reflected that the light distribution of the light 10 meets consumer preferences. The sidewall 21 can be made substantially smooth by, as examples, forming the indentation 20 with higher tolerances than normal or polishing the indentation 20, while forming an uneven texture in the indentation 20 to diffuse light may prevent the sidewall 21 from being substantially smooth. Alternatively, a reflector can be placed in the indentation 20 to reflect light that refracts through the sidewall 21. However, since reflectors can be less efficient than TIR, the lens 18 can be designed such that a large portion of light is reflected by TIR when contacting the sidewall 21.

Figure 6:
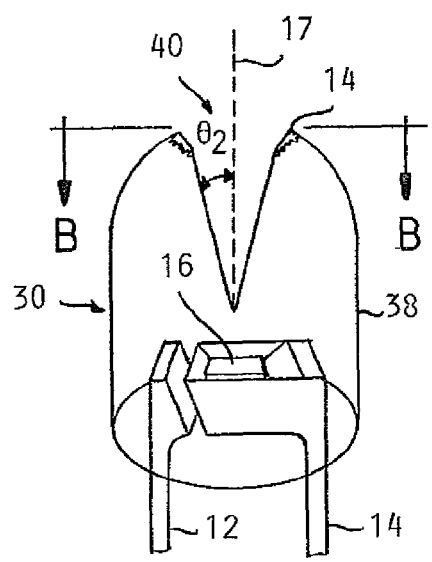
FIG. 6 is a perspective view of another LED according to the invention.
Figure 7:
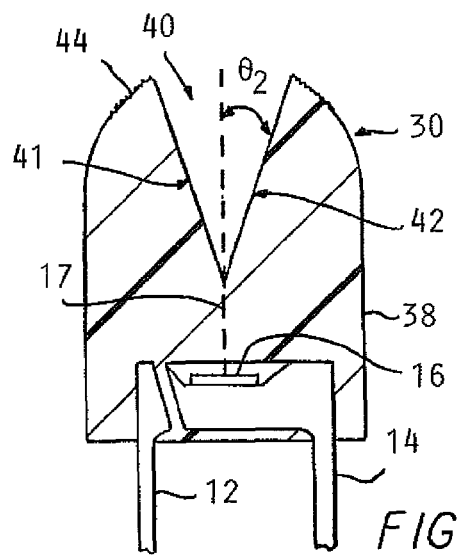
FIG. 7 is a cross section along line B-B of the LED in FIG. 6.

While the indentation 20 described above is conically shaped, an indentation can have an alternative shape and still provide TIR. For example, FIGS. 6 and 7 show another LED package 30 including leads 12 and 14, another LED 16 defining an axis 17, and a lens 38. The lens 38 can be the same as the lens 18 described above, except the lens 38 can include a V-shaped indentation 40 having two angled sidewalls 41 and 42 in place of the conical indentation 20. The indentation 40 can have a width sufficient to block a bright spot produce by the LED 16 shown in FIGS. 6 and 7. The sidewalls 41 and 42 can be angled to produce TIR, with the angles $\theta_2$ between the sidewalls 41 and 42 and the axis 17 less than a complementary angle of a critical angle of the sidewalls 41 and 42. The geometry of the indentation 40 (i.e., the width and depth of the indentation 40 and the angle $\theta_2$) can be determined with the same considerations as used to determine the geometry of the indentation 20 described above. As illustrated in FIGS. 6 and 7, the angle $\theta_2$ is approximately twenty degrees, and the depth of the indentation 40 is such that a tip of the indentation is adjacent the LED 16.

The lens 38 can provide a more even distribution of light than a known LED, though the distribution of light provided by the lens 38 can differ from the distribution of light provided by the lens 18. For example, when the angle $\theta_2$ is slightly greater or smaller than twenty degrees (e.g., between approximately fifteen and twenty five degrees), the indentation 40 produces two bright lines of light, one along each of its edges. Thus, the V-shaped indentation 40 can tend to create two bright lines separated by a dark line instead of the bright halo circumscribing a dark spot created by the conical indentation 20. However, to reduce the appearance of the dark line, the lens 38 can include a diffusing surface 44 on each side of the indentation 40 to diffuse some of the light that would otherwise contribute to the brightness of the bright lines. The diffusing surface 44 can direct light into the area above the indentation 40, which can reduce the appearance of the dark line. Also, other indentations can have other shapes not illustrated, such as an inverted pyramid shape or an asymmetrical shape.

While the above described lenses 18 and 38 are parts of stand-alone LED packages 10 and 30, respectively, lights can include LEDs having lenses to reduce the appearance of bright spots. For example, FIG. 8 illustrates a light tube 50 shaped like a fluorescent tube and including bi-pin end caps 52, a circuit board 54, a housing 56, and multiple LEDs 58 covered by a lens 60.

One of the bi-pin end caps 52 can be disposed at each longitudinal end of the housing 56 for physically and electrically connecting the light 50 to a fluorescent fixture. The end caps 52 can be electrically connected to the circuit board 54 to provide power to the LEDs 58. Each end cap 52 can include two pins, though two of the total four pins can be "dummy pins" that do not provide an electrical connection. Alternatively, other types of end caps can be used, such as single pin end caps. Also, while the end caps 52 are shown as including cup-shaped bodies, the end caps 52 can have a different configuration (e.g., the end caps 52 can be shaped to be press fit into the housing 56).

Figure 8:
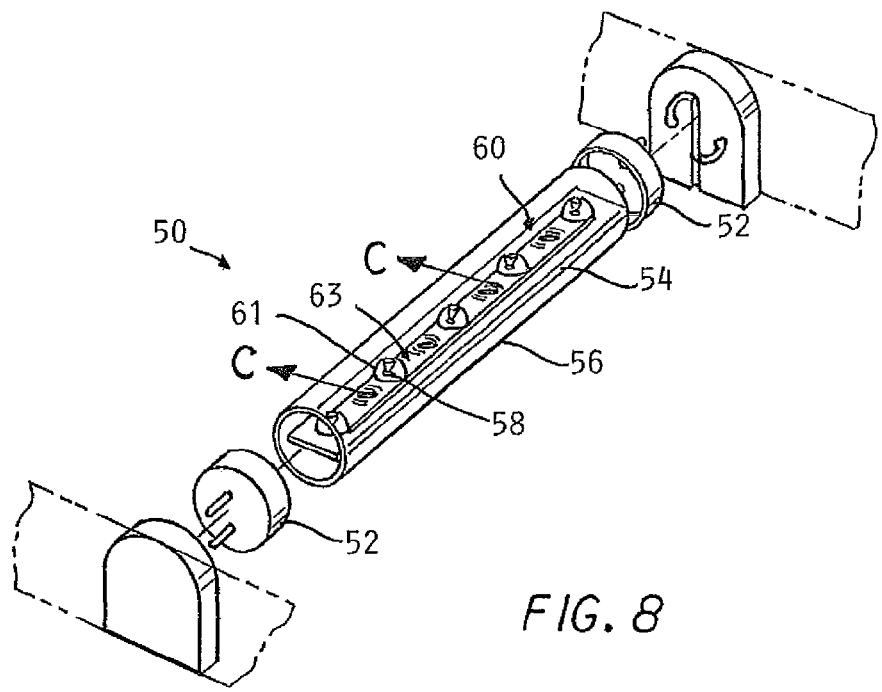
FIG. 8 is a partially exploded, perspective view of an example of a tube-shaped LED light according to the invention.

The circuit board 54 as illustrated in FIG. 8 is an elongate printed circuit board. Multiple circuit board sections can be joined by bridge connectors to create the circuit board 54. The circuit board 54 can be slidably engaged with the housing 56, though the circuit board 54 can alternatively be clipped, adhered, snap- or friction-fit, screwed or otherwise connected to the housing 56. For example, the circuit board 54 can be mounted on a heat sink that is attached to the housing 56. Also, other types of circuit boards may be used, such as a metal core circuit board. Or, instead of a circuit board 54, other types of electrical connections (e.g., wires) can be used to electrically connect the LEDs 58 to the end caps 52.

The housing 56 as shown in FIG. 8 is a light transmitting cylindrical tube. The housing 56 can be made from polycarbonate, acrylic, glass or another light transmitting material (i.e., the housing 56 can be transparent or translucent). For example, a translucent housing 56 can be made from a composite, such as polycarbonate with particles of a light refracting material interspersed in the polycarbonate. While the illustrated housing 56 is cylindrical, the housing 56 can alternatively have a square, triangular, polygonal, or other cross sectional shape. Similarly, while the illustrated housing 56 is linear, the housing 56 can have an alternative shape, e.g., a U-shape or a circular shape. Additionally, the housing 56 need not be a single piece as shown in FIG. 8. Instead, the housing 56 can be formed by attaching multiple individual parts, not all of which need be light transmitting. For example, the housing 56 can include a lower portion and a lens attached to the lower portion to cover the LEDs 58. The housing 56 can be manufactured to include light diffusing or refracting properties, such as by surface roughening or applying a diffusing film to the housing 56. The housing 56 can have a length such that the light 50 is approximately 48" long, and the housing 12 can have a 0.625", 1.0", or 1.5" diameter for engagement with common fluorescent fixtures.

Figure 9:
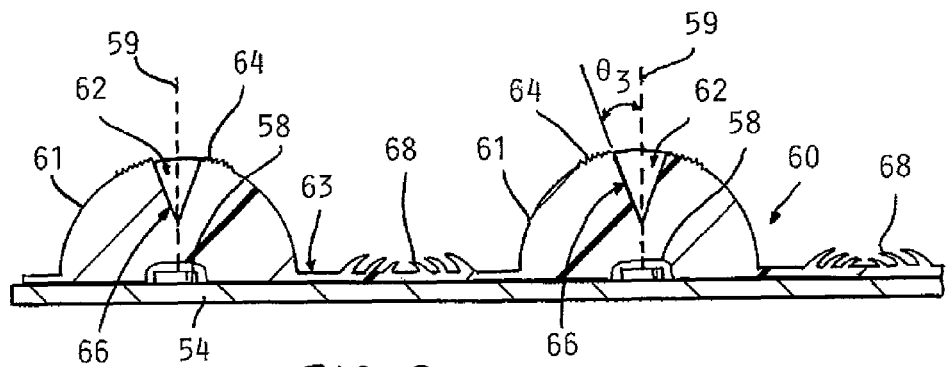
FIG. 9 is a cross section of the light of FIG. 8 along line C-C.

The LEDs 58 can each produce light in a Lambertian distribution centered on a central axis 59, which can extend normally to its respective LED 58 as shown in FIG. 9. However, the LEDs 58 may also exhibit a different distribution of light, in which case the axes 59 can still represent at least one of a center point of the distribution of light of each LED 58 and axes normal to the respective LEDs 58. The LEDs 58 can be LEDs of any power rating, e.g. 0.05 W, 0.10 W, 0.25 W, or high power LEDs, such as surface-mount LEDs of the type available from Nichia. The LEDs 58 can produce any wavelength of light, such as white light, red light, blue light, or ultra-violet light.

The lens 60 can extend over multiple LEDs 58 as shown in FIG. 9, encasing the LEDs 58 and providing protection from the external environment to reduce corrosion or other damage to the LEDs 60. The lens 60 can be translucent or transparent and can be made from a material such as polycarbonate, acrylic, or glass. The lens 60 can include semispherical portions 61 over each LED 58, and connecting portions 63 extending between adjacent hemispherical portions 61. Alternatively, discrete lenses consisting of only the semispherical portions 61 can be used for each LED 58.

Each hemispherical portion 61 can define an indentation 62 and a diffusing surface 64. The indentation 62 can be conical with a continuous sidewall 66 angled at an angle $\theta_3$ relative to the respective axis 59. Each indentation 62 can be centered over one of the axes 59, and the indentation 62 can have a diameter sufficient in diameter to reduce a bright spot of light produced by its respective LED 58. The specific geometry of the indentation 62 can be based on the same considerations discussed above in reference to the indentation 20.

Further, as shown in FIGS. 8 and 9, the angle $\theta_3$ can be approximately twenty degrees, and the indentation 62 can extend to adjacent its respective LED 58. An annular diffusing surface 64 can circumscribe the indentation 62. Thus, the indentation 62 can reduce a bright spot of light produced by the LED 58, directing the light to form a bright halo circumscribing the indentation 62. The diffusing surface 64 can diffuse the halo of light to reduce the appearance of a dark spot created by the indentation 62 and to more evenly distribute the light radially relative to the axis 59.

The lens 60 additionally includes connecting portions 63. Each connecting portion 63 can include a Fresnel type lens 68 approximately midway between adjacent hemispherical portions 61. A portion of light produced by the LEDs 58 may not enter the hemispherical portions 61 of the lens 60. Instead, this light may enter one of the connecting portions 63. The connecting portion 63 can act as a light pipe, directing light to the Fresnel lens 68. The Fresnel lens 68 can direct the light outward, away from the circuit board 54. However, depending on the design of the connecting portion 63, some of the light may refract out of the connecting portion prior to reaching the Fresnel lens 68. As a result, the lens 60 can reduce the appearance of dark spots between hemispherical portions 61.

Figure 10:
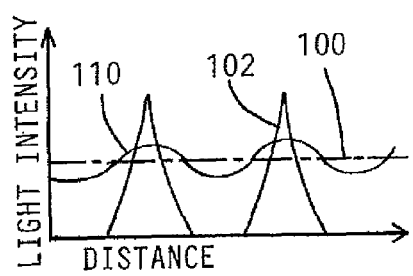
FIG. 10 is a graph showing a light intensity distribution of the light shown in FIG. 8 compared to a fluorescent tube.

FIG. 10 illustrates the distribution of light from the light 50 as indicated by line 110 compared to a fluorescent tube as indicated by the line 100 and a known LED light shaped as a tube as indicated by the line 102. The distribution of light from the lens 60 around each LED 58 can include two peaks on opposing sides of a trough, similar to the distribution of light described with reference to FIG. 5. The peaks can be of lower intensity than the peak of the spiked light distribution of the known LED light shaped as a tube. Further, due to diffusion of the bright halo of light and the placement of Fresnel lenses 68 between hemispherical portions 61, the lens 60 can provide a more even distribution of light between LEDs 58 compared to the known LED light shaped as a tube. Thus, while the light 50 can avoid the spiked peaks of the known LED light, the light 50 can also have a more even distribution between LEDs 58 compared to the known LED light.

Figure 11:
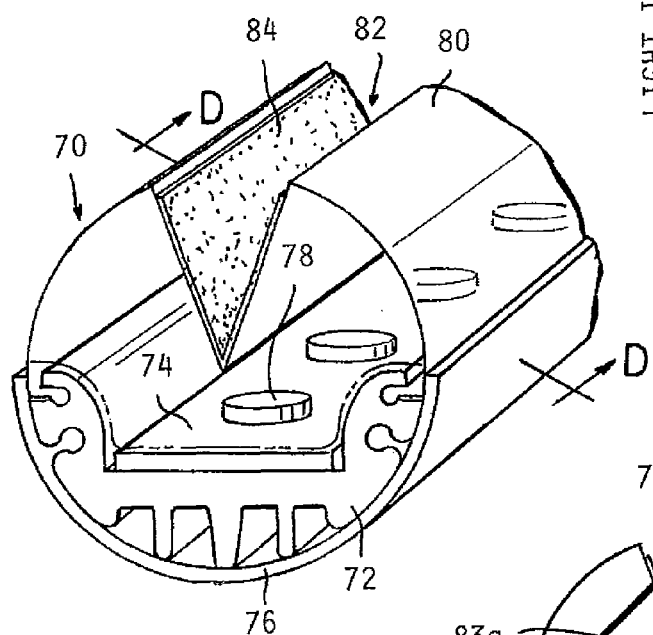
FIG. 11 is a partial perspective view another tube shaped LED light according to the invention.

Additionally, while the above described embodiments describe lenses that are integral with an LED package (i.e., the lenses function as casings for LEDs), this need not be the case. For example, FIG. 11 illustrates an LED light 70 shaped to replace a fluorescent tube including a heat sink 72, a circuit board 74, a lower cover 76, LEDs 78, and an upper cover 80 that functions as a lens. The heat sink 72 can be made from a highly thermally conductive material such as aluminum, copper, or another material, and it can be shaped to have a large surface area. However, the heat sink 72 may not be necessary depending on the amount of heat produced by the LEDs 78. The circuit board 74 can be a printed circuit board or another type of circuit board, and the LEDs 78 can be physically and electrically connected to the circuit board 74. The circuit board 74 can be mounted on the heat sink 72. Alternatively, the LEDs 78 can be electrically connected with a structure other than a circuit board 74, such as wires.

Figure 12:
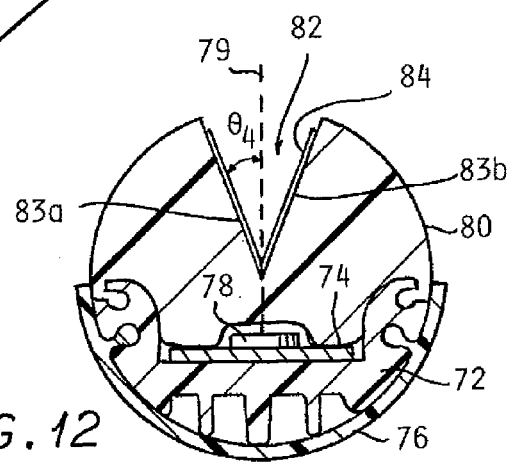
FIG. 12 is a cross section of the light shown in FIG. 11 along line D-D.

The lower cover 76 can be made from a polymer such as polycarbonate or ABS, and lower cover 76 can be generally U-shaped and engaged with the heat sink 74. For example, the lower cover 76 can be sized to slidably receive the heat sink 74, though the cover 76 can alternatively be bonded or otherwise adhered to the heat sink 74. Further, the lower cover 76 can be configured to secure the upper cover 80 in place. For example, the lower cover 76 can define grooves for slidably receiving the upper cover 80. Since little light is directed toward the lower cover 76 as shown in FIGS. 11 and 12, the lower cover 76 need not be light transmitting. For example, the lower cover 76 can be a dark body with a high thermal emissivity. Alternatively, the lower body 76 and upper body 80 can be integral, e.g., the two bodies 76 and 80 can form a generally cylindrical housing.

The LEDs 78 can be similar to the LEDs 58, with each LED 78 producing light in a Lambertian distribution about a central axis 79 as shown in FIG. 12. The upper cover 80 can define a V-shaped indentation 82 extending longitudinally the length of the cover 80, and the indentation 82 can be centered above the axes 79 of the LEDs 78. The indentation 40 can have a width sufficient to block multiple bright spots produce by the LEDs 78. The sidewalls 83a and 83b can be angled to produce TIR, with the angles $\theta_4$ between the sidewalls 83a and 83b and the axis 79 less than a complementary angle of a critical angle of the sidewalls 83a and 83b. The geometry of the indentation 82 (i.e., the width and depth of the indentation 82 and the angle $\theta_4$) can be determined with the same considerations as used to determine the geometry of the indentation 20 described above. As illustrated in FIGS. 11 and 12, the angle $\theta_4$ is approximately twenty degrees, and the depth of the indentation 82 is such that a tip of the indentation 82 is adjacent the LED 78.

The upper cover 80 can function as a lens to provide a more even distribution of light than known LED lights shaped as fluorescent tubes, though the distribution of light provided by the cover 80 can differ from the distribution of light provided by the lens 60 described above in reference to FIGS. 8 and 9. For example, when the angle $\theta_4$ is slightly greater or smaller than twenty degrees (e.g., between approximately fifteen and twenty five degrees), the indentation 82 results in two bright lines of light along each of its edges when the LEDs 78 produce light. Thus, the V-shaped indentation 82 can tend to create two bright lines separated by a dark line instead of the bright halos circumscribing dark spots created by the hemispherical portions 61 of the lens 60.

Also as shown in FIGS. 11 and 12, a reflector 84 can be positioned to cover the sidewalls 83 of the indentation 82. The reflector 84 can be a reflective film applied to the indentation 82, a reflective material deposited in the indentation 82, or another light reflecting structure. While the sidewalls 83 are angled to produce TIR, manufacturing a perfectly smooth surface is difficult. As a result, the sidewalls 83 may include some imperfections that can allow light to be refracted through the sidewalls 83 instead of reflected. The reflector 84 can reflect light that refracts through one of the sidewalls 83 back through the sidewall 83, in effect acting as a back-up reflector for any light that is not reflecting by the sidewall 83. However, a reflector 84 may not be necessary if the amount of light that refracts through the sidewalls 83 is sufficiently small that the light distribution is acceptable to consumers.

Figure 13:
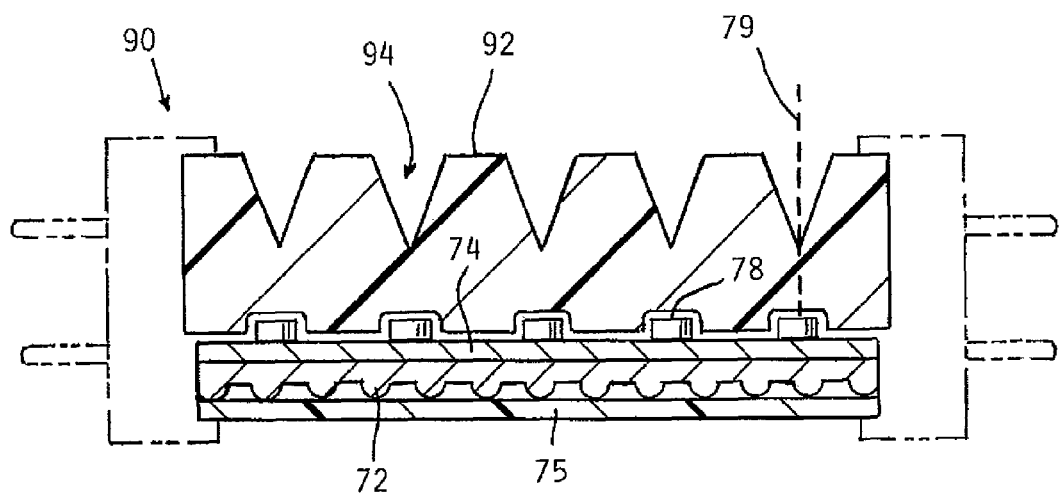
FIG. 13 is a cross section view taken along a longitudinal axis of another tube shaped light according to the invention.

FIG. 13 illustrates another light 90 shaped to replace a fluorescent tube. The light 90 can include the heat sink 72, the circuit board 74, the lower cover 75, and the LEDs 78 defining the central axis 79 as described above in reference to FIGS. 11 and 12. However, the light 90 includes an upper cover 92 having V-shaped indentations 94 extending perpendicular to a longitudinal axis of the light 90. The geometry of the indentations 94 can be determined based on the same considerations as used to determine the geometry of the indentation 82 in FIGS. 11 and 12.

However, the orientation of the indentations 94 causes the light 90 to have a different appearance compared to the light 70. While the light 70 can result in two bright lines extending longitudinally the length of the light 70, the light 90 can result in a series of bright lines extending perpendicular to the longitudinal axis of the light 90. More specifically, each indentation 94 can result in two bright lines extending perpendicularly to the longitudinal axis of the light 90 due to the orientation of the indentations 94. A dark line created by the indentation 94 can separate the two lines. The darkness of this line can be mitigated by, for example, including a diffusing surface on each side of the indentation 94. An additional dark line can exist between adjacent indentations 92, though the exact distribution of light between the indentations 92 can vary depending on the spacing of the LEDs 78 and the geometries of the indentations 92. Alternatively, a cover can be formed to include conical indentations, pyramid shaped indentations, or other indentation shapes.

Figure 14:
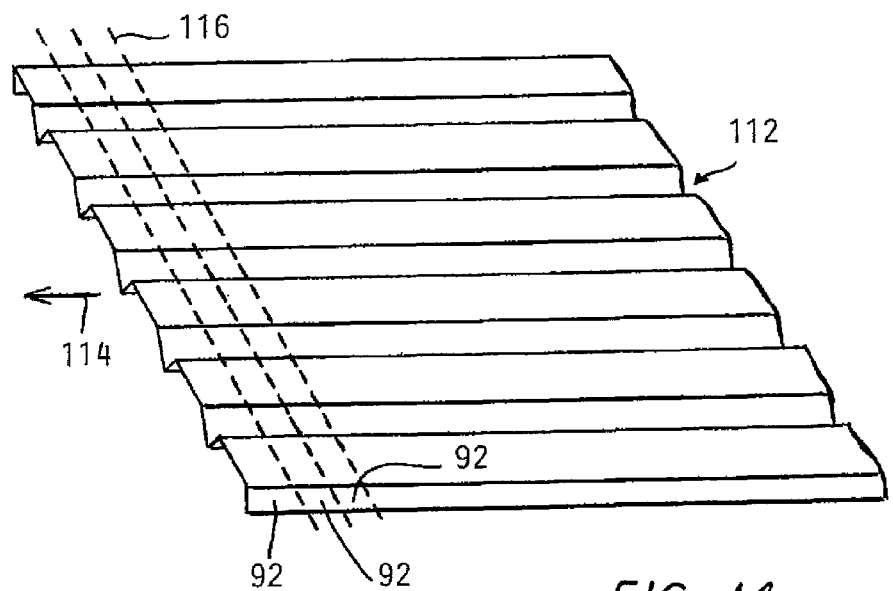
FIG. 14 is a perspective view of an extruded sheet of lenses according to the invention.

The cover 92 shown in FIG. 13 can be formed by extrusion. As shown in FIG. 14, a sheet 112 of material such as polycarbonate or acrylic can be extruded in an extrusion direction 114 to produce the cover 92. Once extruded, the sheet 112 can have the same profile (i.e., shape when viewed from the extrusion direction 92) as the cover 92. However, the sheet 112 can have a width greater than a width of the cover 92. The sheet 112 can be cut or otherwise sectioned perpendicularly to the extrusion direction 114 as indicated by lines 116 to produce multiple covers 92. Alternatively, the sheet 112 can be extruded to have a different shape, such as the cover 80 shown in FIG. 11. However, in that case, the sheet can be cut parallel to the extrusion direction to produce the covers 80.

While the above described lights 50, 70, and 90 are shaped to replace fluorescent tubes, a lens as described herein can also be used in other types of lights, such as flashlights and lights shaped to replace incandescent bulbs.

FIGS. 15 and 16 illustrate another embodiment of a light tube 120 shaped like a fluorescent tube and similar to that shown in FIG. 8 in that it includes bi-pin end caps (not shown), a circuit board 124, a housing 126, and multiple LEDs 128 covered by light pipes 131 functioning as lenses therefore. The bi-pin end caps, the circuit board 124, the housing 126, and the multiple LEDs 128 can be similar to the bi-pin end caps 52, the circuit board 54, the housing 56, and multiple LEDs 58, respectively, of FIG. 8. Alternatively, other components may be used as desired or required.

Each light pipe 131 can be adjacent to another light pipe 131 so that a space 129 exists between adjacent light tubes. The light pipe 131 can be made of any suitable light transmitting material such as acrylic. The light pipe 131 can have a generally rectangular cross section and a level surface although other suitably shaped light pipes are also available. Further, the light pipe 131 may be of any sufficient size to provide an even distribution of light in the light tube 120, as discussed in more detail below, across the length and width thereof.

The space 129 can be of any suitable dimension as desired or required. Alternatively, in other embodiments, no space can exist between adjacent light pipes 131 (i.e. light pipes are physically touching), a single light pipe can extend over all or most of the LEDs 128 or a single light pipe can be positioned over more than one LED 128.

Each light pipe 131 can define a conical indentation 132 with a continuous sidewall 136 angled at an angle $\theta_5$ relative to a central axis 135. The indentation 132 can be shaped to provide TIR and reflect light down the light pipe 131. Each indentation 132 can be centered over one of the axes 135, and the indentation 132 can have a diameter sufficient in size to reduce a bright spot of light produced by its respective LED 128. The specific geometry of the indentation 132 can be determined using the same considerations (i.e., the width and depth of the indentation 132 and the angle $\theta_5$) described above in reference to the indentation 20. For example, the angle $\theta_5$ can be approximately twenty degrees, and the indentation 132 can extend to adjacent its respective LED 128. Further, the conical indentation 132 is illustrated as having a planar surface, in other embodiments the conical indentation can have a curved surface.

The light pipe 131 permits the light L to be transported across the surface thereof through TIR. The light is extracted at multiple points P1-P4, as discussed in more detail below by a diffusing surface 134. Further, the light L diminishes at, for example, points P1 and P4 (i.e. points that are further from the light source LED 128) as the light is transported down the length of the pipe. The indication of points P1-P4 and illustration of the light L are provided in order to allow easy understanding of the invention and do not limit the scope of embodiments of the invention. Other embodiments may have more or less points where the light is emanated and reflected and may have a different distribution of light L.

The diffusing surface 134 disrupts the TIR to permit light to emanate at points P1-P4. The diffusing surface 134 can be, for example, grooves, pits, bumps or any other type of extraction elements and be any combination thereof. Each extraction element of diffusing surface 134 may be of varying size and at the same or different distances from other extraction elements. The diffusing surface may be printed, formed as a part of or otherwise adhered to a top surface 131c of the light pipe 131. Alternatively the diffusing surface maybe printed, formed as a part of or otherwise adhered on a bottom surface 131d of the light pipe 131. The light L emanating at points P1-P4 may strike diffusing surface 134 and be diffused thereby. The emitted light may emanate from the light pipe 131 in a variety of directions. The light L may also be emanated in a direction back within the light pipe 131.

The pattern of the diffusing surface 134 can be, for example, selected to provide a substantially uniform distribution of light across the length and width of the light pipe 131. The diffusing surface 134 can be evenly spread across each light pipe 131 or, as illustrated in FIG. 15, be more densely disbursed at the distal ends 131a and 131b. The selection of a pattern for the diffusing surface 134 can include, for example, selecting the size of the elements or the spatial density of the elements in diffusing surface 134. By controlling the pattern of the diffusing surface 134, the distribution of light may be controlled along the length and width of the light pipe 131. Thus, for example, because of the increased distance from the LED 128, a reduced amount of light may be emitted at the distal ends 131a and 131b. To compensate for this reduced amount of light, the pattern of diffusing surface 134 can be selected such that, for example, the light L, can be diffused more at points P1 and P4 than at points P2 and P3 in order to provide a more even distribution of light. Of course, other patterns of diffusing surfaces are also available.

While the indentation 132 is conically shaped, an indentation can have an alternative shape and still provide TIR. For example, FIG. 17 shows another cross section of a light tube including, similar to the light tube illustrated in FIGS. 15 and 16, a circuit board 154, with light pipes 161 over each LED 158 with light emanating at points P5-P8. Each light pipe 161 can be adjacent to another light pipe 161 so that a space 159 exists between adjacent light pipes. Additionally, the light pipe 131 can also include a diffusing surface (not shown) that is similar to diffusing surface 134. However, light pipes 161 in this embodiment include a V-shaped indentation 152 (similar to that shown in FIGS. 6 and 7). Each V-shaped indentation has two angled sidewalls 166a and 166b and can have a width sufficient to block a bright spot produce by the LED 158. The sidewalls 166a and 166b can be angled to produce TIR, with the angles $\theta_6$ between the sidewalls 166a and 166b and the axis 165 less than a complementary angle of a critical angle of the sidewalls 166a and 166b. The geometry of the indentation 132 (i.e., the width and depth of the indentation 132 and the angle $\theta_6$) can be determined with the same considerations as used to determine the geometry of the indentation 20 described above.

While the light pipes 131 and 161 have a generally rectangular cross section and a level top surface, a light pipe can have an alternative shape. For example, FIG. 18 shows another cross section of a light tube including, similar to the light tube illustrated in FIGS. 15 and 16, a circuit board 184, with light pipes 181 over each LED 188. Each light pipe 181 can be adjacent to another light pipe 181 so that a space 189 exists between adjacent light pipes. Each light pipe 181 includes a conical indentation 182 (similar to that shown in FIGS. 15 and 16). Additionally, the light pipe 161 can also include a diffusing surface (not shown) that is similar to diffusing surface 134. However, the top surface 181c of the light pipes 181 in this embodiment include can taper from the conical indentation 182 toward the distal end 181a and from the conical indentation 182 toward the distal end 181b. The tapered surface permits TIR failure to occur, which can assist in providing a more even distribution of light across the light emitted at points P9-P12. As the light L propagates down the light guide toward both the distal ends 181a and 181b, its angle of incidence constantly decreases due to the tapered surface 181c. As the angle of incidence nears a line normal to the tapered surface 181c, some of the light L is no longer totally internally reflected and eventually is emitted from the light pipe 181 after a sufficient number of internal reflections. Further, the tapered surface 181c permits an increased number of internal reflections as compared to a level surface (e.g. FIGS. 15 and 16) which can permit additional opportunities to intercept an extraction element of the diffusing surface on light pipe 181.

FIG. 19 illustrates another cross section of a light tube. Similar to the light tube illustrated in FIGS. 15 and 16, the light tube of this embodiment includes a circuit board 214, with light pipes 211 over each LED 218. However, in this embodiment the light pipe does not include an indentation but rather a reflector 212. The reflector 218 can be a reflective film applied to a top surface 211c of the light pipe 211, a reflective material deposited on a top surface 211c of the light pipe 211, or another light reflecting structure. As one non-limiting example, in one embodiment, the reflector 84 is a polymer film reflector deposited on the top surface 211c of the light pipe 211.

The reflector 218 can cover the LED 218. Specifically, the reflector 218 can be positioned such that the light L emitted directly from the LED 128 would strike the reflector 218 and experience TIR. As such, the reflector can additionally cover an area slightly surrounding the LED 218 as desired or required.

After the light L strikes the reflector 218, the light can be transported through the light pipe 211 similar to the manner described in FIGS. 15 and 16. Additionally, the light pipe 211 can also include a diffusing surface (not shown) that is similar to diffusing surface 134 for disrupting TIR from the reflector 218 and to permit light to emanate at, for example, points P13-P16. The diffusing surface can be, as discussed previously, uniformly distributed or exhibit a particular pattern on the top surface 211c or the bottom surface 211d of light pipe 211. More specifically, for example, the diffusing surface can be located on any portion of the top surface 211c excluding the portion covered by reflector 218. A diffusing reflecting layer 232 may also be added under a bottom surface 211d of the light pipe. The diffusing reflecting layer 232 can assist in transporting the light L through light pipe 211 and can assist in disrupting TIR from reflector 218. Alternatively, the diffusing reflecting layer 232 can be a diffusing layer similar to diffusing surface 134 (or any other suitable diffusing layer) or a reflecting layer similar to reflector 218 (or any other suitable reflecting layer).

Although the light pipes 131, 161, 181 and 211 illustrate light L emitted through the top surface thereof, in other embodiments, light may be extracted and emitted in any direction such the top, bottom, sides or ends of the light pipes. For example, in one embodiment, a light tube can include light pipes that extract and emit light in all directions (i.e. 360°). Further, as discussed previously, the LEDs 128, 158, 188 and 218 may be any suitable LED white or colored LED. If the LEDs 128, 158, 188 and 218 are colored LEDs, a wavelength-converting material may be included in, on or outside the light pipes 131, 161, 181 and 211, respectively. Alternatively, a wavelength-converting layer can be included between LEDs 128, 158, 188 and 218 and the light pipes 131, 161, 181 and 211, respectively.

As discussed previously, LED packages containing conical indentation 20 and V-shaped indentation 40 can create the appearance of a bright halo of light circumscribing a dark spot. A way of mitigating the dark spot is to provide, for example a diffusing surface around the indentations such that the bright halo of light is diffused. Other light tubes are available having a double-coned LED package and or a double-coned lens to obfuscate the bright spot created by the LED while also mitigating the dark spot by further spreading the light rays.

For example, FIGS. 20 and 21 describe a light tube 300, which can include, similar to the light tube 70 of FIGS. 11 and 12, a heat sink 302, a circuit board 304, a lower cover 306, LEDs 308, and an upper cover 310 and a double-coned linear lens 311 extending over the LEDs 308. The heat sink 302, circuit board 304, lower cover 306 and LEDs 308 can be similar to heat sink 72, circuit board 74, lower cover 76 and LEDs 78, respectively. The upper cover 310 can be U-shaped and can snap onto the lower cover 306. Alternatively, other components may be used as desired or required or other components may be eliminated (e.g. heat sink 302).

Each LED 308 produces light in a Lambertian distribution about a central axis 309 as shown in FIG. 21. The double-coned linear lens 311 extends substantially the entire length of the light tube 300 and includes a V-shaped indentation 312 formed by sidewalls 311a and 311b. The V-shaped indentation 312 also extends substantially the entire length of the light tube 300. The indentation 312 can have a width sufficient to block multiple bright spots produce by the LEDs 308. The sidewalls 311a and 311b can be angled to produce TIR, with the angles $\theta_7$ between the sidewalls 311a and 311b and the axis 309 less than a complementary angle of a critical angle of the sidewalls 311a and 311b. The geometry of the indentation 312 (i.e., the width and depth of the indentation 312 and the angle $\theta_7$) can be determined with the same considerations as used to determine the geometry of the indentation 20 described above. As illustrated in FIGS. 20 and 21, the angle $\theta_7$ is approximately twenty degrees.

The linear lens 311 also includes two flared outer walls 311c and 311d extending from edges 311e and 311f, respectively. Edge 311e is formed by an intersection of sidewall 311a and outer wall 311c and edge 311f is formed by an intersection of sidewall 311b and outer wall 311d. Two base walls 311g and 311h vertically extend to the circuit board 304 from edges 311i and 311k. Edge 311i is formed by an intersection of outer wall 311c and base wall 311g and edge 311k is formed by an intersection of outer wall 311d and base wall 311h.

Outer walls 311c and 311d can be angled relative to a horizontal axis 320 to receive the totally internally reflected light from sidewalls 311a and 311b and to redirect the light into an external path parallel and/or substantially parallel to a central axis 309. In other words, the primary light rays L1 are redirected to produce light rays L2 in this manner by, for example, angling outer walls 311c and 311d at suitable angles $\theta_8$. Angle $\theta_8$ is the angled between outer walls 311c and 311d and horizontal axis 320. As illustrated in FIGS. 20 and 21, angle $\theta_8$ is approximately seventy-four degrees. Accordingly, the outer walls 311c and 311d of linear lens 310 can reduce or eliminate the dark spot created by indentation 320 by spreading light rays L2 thereto.

Additionally, linear lens 311 can also include an optional reflector 315 on end surfaces 311k (only one end surface shown in FIG. 20) of linear lens 311 to provide, for example, maximum internal reflection. Reflector 315 can reflect any wasted and/or uncontrolled light from exiting through the end surfaces 311k back through the linear lens 311. Accordingly, reflector 315 can be, for example a mirrored surface. In other embodiments, the reflector 315 can be a reflective film applied to the end surfaces 311k, a reflective material deposited on the end surfaces 311k, or another light reflector. Reflector 315 can be optional because, for example, the amount of light that exits the linear lens 311 through end surfaces 311k may be minimal and the light distribution provided by the light tube 300 may be suitable.

While the double-coned concept is implemented within a linear lens and is described above as extending through the light tube, other embodiments may include the double-coned concept as part of an LED package. For example, FIGS. 22 and 23 show another LED package 400 including leads 412 and 414, another LED 416 centered about a central axis 417 and a lens 408. Leads 412 and 414, LED 416 and axis 417 can be similar to leads 12 and 14, LED 16 and axis 17, respectively, of FIGS. 3, 4, 6 and 7.

Lens 408 includes a V-shaped indentation 440 having two angled sidewalls 441 and 442. The indentation 440 can have a width sufficient to block a bright spot produce by the LED 416. The sidewalls 441 and 442 can be angled to produce TIR, with the angles $\theta_9$ between the sidewalls 441 and 442 and the axis 417 less than a complementary angle of a critical angle of the sidewalls 41 and 42. The geometry of the indentation 440 (i.e., the width and depth of the indentation 440 and the angle $\theta_9$) can be determined with the same considerations as used to determine the geometry of the indentation 20 described above. As illustrated in FIGS. 22 and 23, the angle $\theta_9$ is approximately twenty degrees.

The lens 408 also includes a circumferentially flared outer wall 450 extending from points (or edges) 452 and 454, respectively. Point 452 is formed by an intersection of sidewall 441 and outer wall 450 and point 454 is formed by an intersection of side wall 442 and outer wall 450. A circumferentially extending base wall 456 vertically extends from an edge 458. Edge 458 is formed by an intersection of outer wall 450 and base wall 456.

Outer wall 450 can be angled relative to a horizontal axis 467 to receive the totally internally reflected light from sidewalls 441 and 442 and, similar to the linear lens 311 of FIGS. 20 and 21, to redirect the light into an external path parallel and/or substantially parallel to the central axis 417. Outer walls can be angled at angle $\theta_{10}$ to produce the redirected light to reduce or eliminate the dark spot created by indentation 440. As illustrated in FIGS. 22 and 23, angle $\theta_{10}$ approximately seventy-four degrees.

In another example, FIGS. 24 and 25 show another LED package 500 including leads 512 and 514, another LED 516 centered about a central axis 517 and a lens 508. Leads 512 and 514, LED 516 and axis 517 can be similar to leads 12 and 14, LED 16 and axis 17, respectively, of FIGS. 3, 4, 6 and 7.

Rather than a V-shaped indentation as described in lens 408, lens 508 includes a conical indentation 540 having an angled sidewall. The indentation 440 can have a width sufficient to block a bright spot produce by the LED 416. Sidewall 541 can be angled to produce TIR, with the angles $\theta_{11}$ between the sidewall 541 and the axis 517 less than a complementary angle of a critical angle of the sidewall 541. The geometry of the indentation 540 (i.e., the width and depth of the indentation 540 and the angle $\theta_{11}$) can be determined with the same considerations as used to determine the geometry of the indentation 20 described above. As illustrated in FIGS. 24 and 25, the angle $\theta_{11}$ is approximately twenty degrees.

The lens 508 also includes a circumferentially flared outer wall 550 extending from an annular edge 542. Annular edge 542 is formed by an intersection of sidewall 541 and outer wall 550. A circumferentially extending base wall 556 vertically extends from an edge 558. Edge 558 is formed by an intersection of outer wall 550 and base wall 556.

Outer wall 550, similar to outer wall 450 of FIGS. 22 and 23, can be angled relative to a horizontal axis 567 to receive the totally internally reflected light from sidewall 541. Outer wall 550 can then, as discussed previously, redirect the light into an external path parallel and/or substantially parallel to the central axis 517. Outer walls can be angled at angle $\theta_{12}$ to produce the redirected light to reduce or eliminate the dark spot created by indentation 540. As illustrated in FIGS. 24 and 25, angle $\theta_{11}$ approximately seventy-four degrees.

Figure 26:
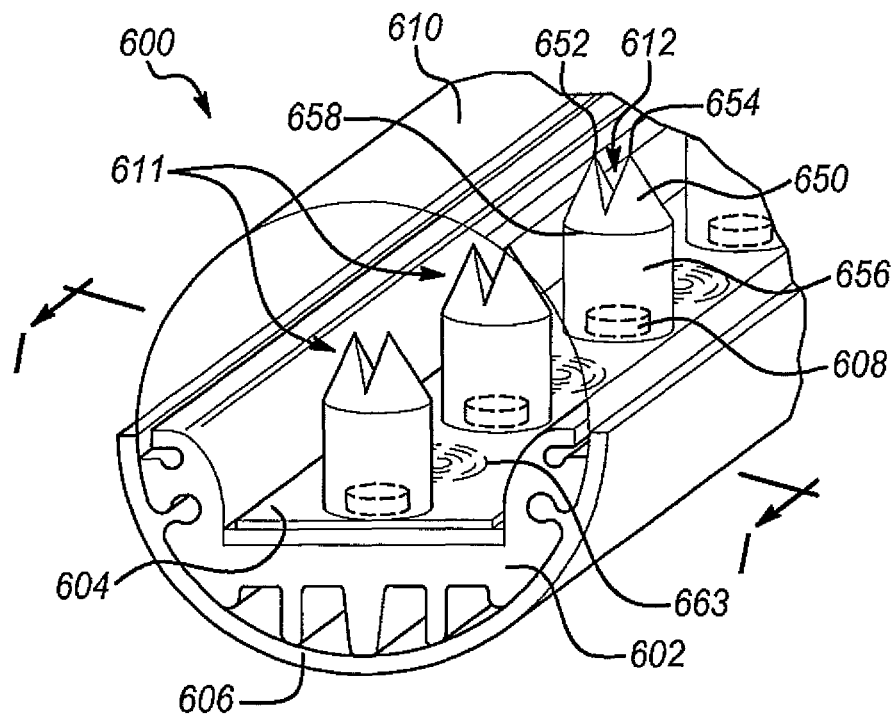
FIG. 26 is a perspective view of another example of a tube-shaped LED light according to the invention.
Figure 27:
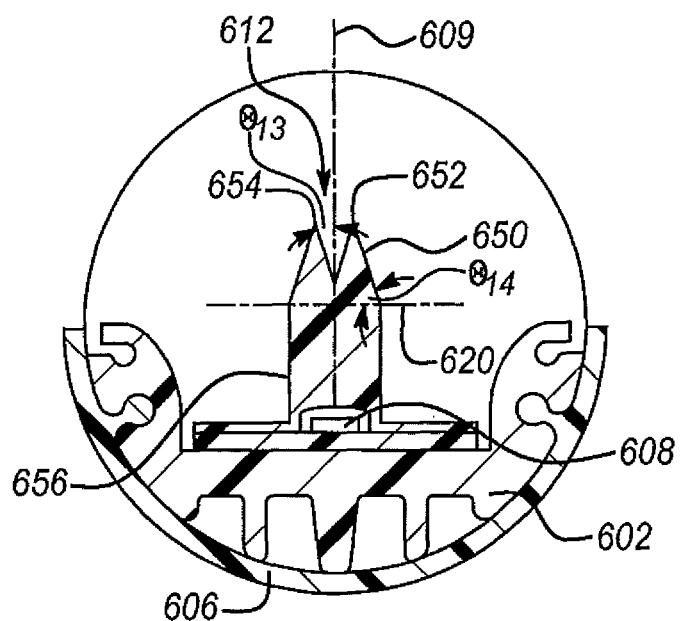
FIG. 27 is a cross section of the light of FIG. 26 along line I-I.

While the above described lenses 408 and 508 are parts of stand-alone LED packages 400 and 500, respectively, lights can include LEDs having lenses incorporating the double-coned structure. For example, FIGS. 26 and 27 illustrate a light tube 600, which can include a heat sink 602, a circuit board 604, a lower cover 606, LEDs 608, an upper cover 610 and double-coned lens portions 611 extending over the LEDs 608. The heat sink 602, circuit board 604, lower cover 606 and LEDs 608 can be similar to heat sink 72, circuit board 74, lower cover 76 and LEDs 78, respectively, of the light tube 70 illustrated in FIGS. 11 and 12. The upper cover 610 can be U-shaped and can snap onto the lower cover 606. Alternatively, other components may be used as desired or required or other components may be eliminated (e.g. heat sink 602).

Additionally, light tube 600 can include connecting portions 663 extending between adjacent double-coned portions 611. Connecting portions 663 can be similar to connecting portions 63 illustrated in FIGS. 8 and 9. Alternatively, in other embodiments, light tube 600 may include the double-coned lens portions 711 without the connecting portions 663

Each double-coned portion 611 can define a V-shaped indentation 612 having two angled sidewalls 611a and 611b. The indentation 612 can have a width sufficient to block a bright spot produce by the LED 608. The sidewalls 611a and 611b can be angled to produce TIR, with the angles $\theta_{13}$ between the sidewalls 611a and 611b and the axis 609 less than a complementary angle of a critical angle of the sidewalls 611a and 611b. The geometry of the indentation 612 (i.e., the width and depth of the indentation 612 and the angle $\theta_{13}$) can be determined with the same considerations as used to determine the geometry of the indentation 20 described above. As illustrated in FIGS. 26 and 27, the angle $\theta_{13}$ is approximately twenty degrees.

The double coned portion 611 also includes a circumferentially flared outer wall 650 extending from points (or edges) 652 and 654, respectively. Point 652 is formed by an intersection of sidewall 611a and outer wall 650 and point 654 is formed by an intersection of side wall 611b and outer wall 650. A circumferentially extending base wall 656 vertically extends from an edge 658. Edge 658 is formed by an intersection of outer wall 650 and base wall 656.

Outer wall 650 can be angled relative to a horizontal axis 620 to receive the totally internally reflected light from sidewalls 611a and 611b, similar to the linear lens 311 of FIGS. 20 and 21, to redirect the light into an external path parallel and/or substantially parallel to the central axis 609. Outer walls can be angled at angle $\theta_{14}$ to produce the redirected light to reduce or eliminate the dark spot created by indentation 612. As illustrated in FIGS. 26 and 27, angle $\theta_{14}$ approximately seventy-four degrees.

Figure 28:
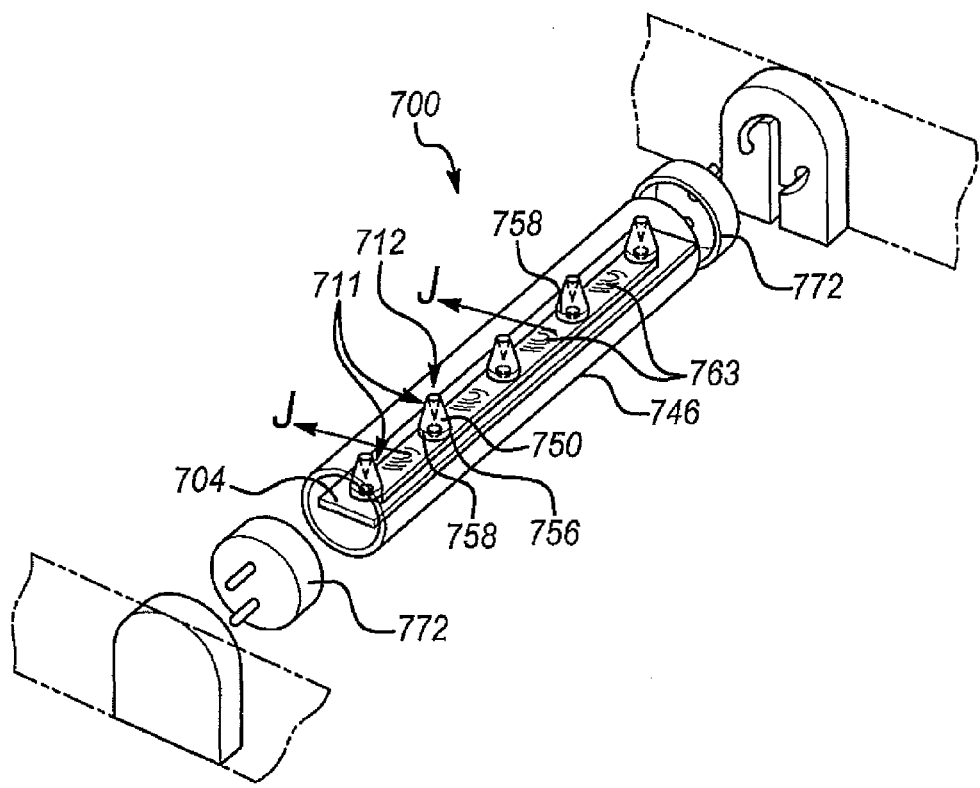
FIG. 28 is a partially exploded, perspective view of another example of a tube-shaped LED light according to the invention.
Figure 29:
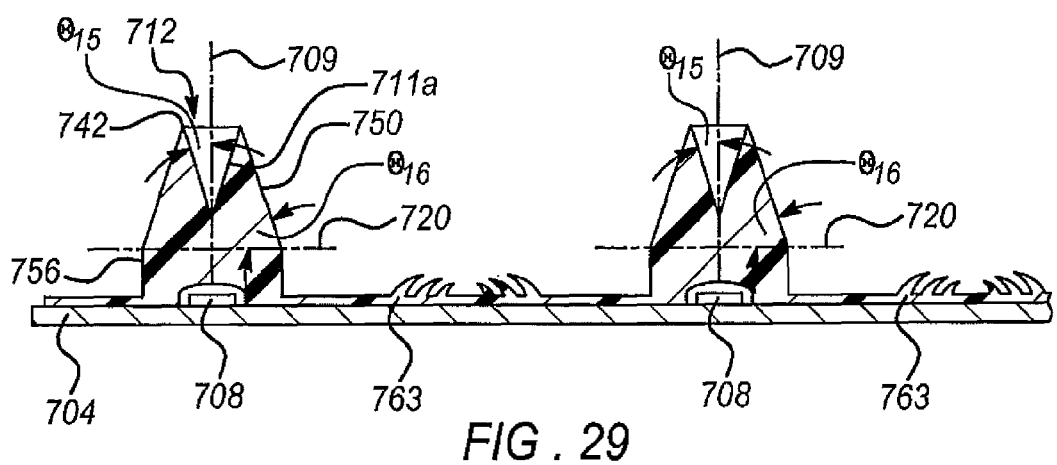
FIG. 29 is a cross section of the light of FIG. 28 along line J-J.

In another example, FIGS. 28 and 29 show another light tube 700 shaped like a fluorescent tube and including bi-pin end caps 772, a circuit board 704, a housing 756, multiple LEDs 708 and conical lens portions 711 over the LEDs 708. Bi-pin end caps 772, circuit board 704, housing 756 and LEDs 708 can be similar to bi-pin end caps 52, circuit board 54, housing 56 and LEDs 58 of FIGS. 8 and 9.

Conical lens portions 711 extend over each LED 708 similar to double-coned portions 611. However, rather than a V-shaped indentation, each portion 711 includes a conical indentation 740 having an angled sidewall 711a. The indentation 740 can have a width sufficient to block a bright spot produce by the LED 708. Sidewall 711a can be angled to produce TIR, with the angles $\theta_{15}$ between the sidewall 711a and the axis 709 less than a complementary angle of a critical angle of the sidewall 711a. The geometry of the indentation 740 (i.e., the width and depth of the indentation 740 and the angle $\theta_{15}$) can be determined with the same considerations as used to determine the geometry of the indentation 20 described above. As illustrated in FIGS. 28 and 29, the angle $\theta_{15}$ is approximately twenty degrees.

Each portion 711 also includes a circumferentially flared outer wall 750 extending from an annular edge 742. Annular edge is 742 formed by an intersection of sidewall 711a and outer wall 750. A circumferentially extending base wall 756 vertically extends from an edge 758. Edge 758 is formed by an intersection of outer wall 750 and base wall 756.

Outer wall 750, similar to outer wall 450 of FIGS. 22 and 23 and outer wall 550 of FIGS. 24 and 25, can be angled relative to a horizontal axis 720 to receive the totally internally reflected light from sidewall 741. Outer wall 750 can then, as discussed previously, redirect the light into an external path parallel and/or substantially parallel to the central axis 709. Outer walls can be angled at angle $\theta_{16}$ to produce the redirected light to reduce or eliminate the dark spot created by indentation 712. As illustrated in FIGS. 28 and 29, angle $\theta_{16}$ approximately seventy-four degrees.

The above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed:

1. A light modifier for an LED producing light about a central axis, the light modifier comprising:
a lens defining an indentation to produce total internal reflection (TIR), the indentation angled relative to the central axis by an amount less than a complementary angle of a critical angle of the lens along the indentation such that light produced by the LED is at least substantially internally reflected by the indentation to pass through a light transmitting portion of the lens directly bordering an outer edge of the indentation to form a line of light, wherein:
the indentation is angled between approximately 15 and 25 degrees relative to the central axis such that two lines of light are formed along a length of the indentation when the LED produces the light and the light is reflected to pass through the light transmitting portion of the lens; and
the indentation includes two sidewalls forming a V-shape, each sidewall having one of the two lines of light formed along its outer edge.

2. The light modifier of claim 1, wherein the indentation is angled approximately 20 degrees relative to the central axis.

3. The light modifier of claim 1, wherein the entire indentation is angled a same degree relative to the central axis.

4. The light modifier of claim 1, wherein:
absent the lens, a distribution of the light produced by the LED in an area radial of the central axis includes a bright spot having a diameter,
the outer edge of the indentation is disposed in the area,
a width of the indentation at the outer edge is at least as large as the diameter of the bright spot produced by the LED, such that the indentation redistributes the light of the bright spot to pass through the light transmitting portion but creates a dark spot at the indentation, and
the indentation is angled such that a resulting distribution of the light produced by the LED in the area is substantially even across the indentation and the light transmitting portion.

5. The light modifier of claim 1, wherein a surface of the indentation is substantially smooth.

6. The light modifier of claim 1, further comprising a reflector within the indentation.

7. The light modifier of claim 1, wherein an outer surface of the lens outwardly extends from the outer edge of the indentation to a lower cover.

8. The light modifier of claim 7, wherein the outer surface is angled relative to a horizontal axis approximately between 70 and 80 degrees.

9. A replacement light for a fluorescent tube usable in a fluorescent fixture comprising:
a support structure having a longitudinal axis;
at least one LED connected to the support structure, the LED producing light about respective central axes;
at least one lens positioned along the central axis of the at least one LED to produce total internal reflection (TIR), the lens defining an indentation angled relative to the central axis less than a complementary angle of a critical angle of the lens along the indentation such that light produced by the at least one LED is at least substantially internally reflected by the indentation to pass through a light transmitting portion of the lens directly bordering an outer edge of the indentation to form a line of light, wherein:
the indentation is angled between approximately 15 and 25 degrees relative to the central axis such that two lines of light are formed along a length of the indentation when the at least one LED produces the light and the light is reflected to pass through the light transmitting portion of the lens; and
the indentation includes two sidewalls forming a V-shape, each sidewall having one of the two lines of light formed along its outer edge; and
at least one electrical connector at a longitudinal end of the support structure in electrical communication with the at least one LED.

10. The replacement light of claim 9, wherein the lens includes multiple indentations, each indentation positioned along the central axis of one of the at least one LEDs.

11. The replacement light of claim 10, wherein the lens includes integral Fresnel lenses between indentations.

12. The replacement light of claim 9, wherein the lens includes a single V-shaped indentation extending longitudinally a length of the lens.

13. The replacement light of claim 9, wherein the entire indentation is angled approximately 20 degrees relative to the axis.

14. The replacement light of claim 9, wherein the lens includes a light pipe around each indentation.

15. The replacement light of claim 14, wherein the light pipe includes a light diffuser on at least one of a top surface and a bottom surface thereof.

16. The replacement light of claim 14, wherein the light diffuser is more densely disbursed on at least one of the distal ends of the light pipe.

17. The replacement light of claim 14, wherein the at least one LED includes multiple LEDs and the light pipe is positioned over substantially all of the multiple LEDs.

18. The replacement light of claim 14, wherein the light pipe tapers from the indentation toward at least one of the distal ends of the light pipe.

19. The replacement light of claim 9, wherein an outer surface of the lens including the light transmitting portion outwardly extends from the outer edge of the indentation to a lower cover.

20. The replacement light of claim 19, wherein the outer surface is angled relative to a horizontal axis approximately between 70 and 80 degrees.

21. A method of forming a lens for an LED producing light about a central axis, the lens defining an indentation to produce total internal reflection (ITR) angled relative to the central axis less than a complementary angle of a critical angle of the lens along the indentation such that light produced by the LED is at least substantially internally reflected by the indentation to pass through a light transmitting portion of the lens directly bordering an outer edge of the indentation to form a line of light, wherein the indentation is angled between approximately 15 and 25 degrees relative to the central axis such that two lines of light are formed along a length of the indentation when the LED produces the light and the light is reflected to pass through the light transmitting portion of the lens and whereinthe indentation includes two sidewalls forming a V-shape, each sidewall having one of the two lines of light formed along its outer edge, the method comprising:
extruding material in an extrusion direction to form a sheet of greater width than the lens, the sheet having a same profile as the lens; and
sectioning the sheet to form the lens.

22. The method of claim 21, wherein sectioning the sheet including cutting the sheet perpendicular to the extruding direction.

* * * * *